United States Patent
Masuoka et al.

(10) Patent No.: US 7,088,617 B2
(45) Date of Patent: Aug. 8, 2006

(54) NONVOLATILE SEMICONDUCTOR STORAGE DEVICE, AND LIQUID CRYSTAL DISPLAY DEVICE INCLUDING THE SAME

(75) Inventors: Fujio Masuoka, Sendai (JP); Hiroshi Sakuraba, Sendai (JP); Fumiyoshi Matsuoka, Sendai (JP); Syounosuke Ueno, Fujiidera (JP); Ryusuke Matsuyama, Nara (JP); Shinji Horii, Kasaoka (JP)

(73) Assignees: Sharp Kabushiki Kaisha, Osaka (JP); Fujio Masuoka, Miyagi (JP)

( * ) Notice: Subject to any disclaimer, the term of this patent is extended or adjusted under 35 U.S.C. 154(b) by 0 days.

(21) Appl. No.: 10/919,777

(22) Filed: Aug. 16, 2004

(65) Prior Publication Data

US 2005/0047209 A1    Mar. 3, 2005

(30) Foreign Application Priority Data

Aug. 26, 2003    (JP)    ............................. 2003-208875

(51) Int. Cl.
*G11C 16/04*    (2006.01)
(52) U.S. Cl. .............................. 365/185.05; 365/185.17
(58) Field of Classification Search ........... 365/185.11, 365/185.17, 185.19, 185.29, 185.33, 185.05
See application file for complete search history.

(56) References Cited

U.S. PATENT DOCUMENTS 5,654,925 A * 8/1997 Koh et al. ............. 365/185.11
6,240,022 B1 * 5/2001 Sakui et al. ........... 365/185.29
6,370,062 B1 * 4/2002 Choi ..................... 365/185.11
6,728,139 B1 * 4/2004 Masuoka ............... 365/185.29
6,807,100 B1 * 10/2004 Tanaka .................. 365/185.19
6,839,283 B1 * 1/2005 Futatsuyama et al. . 365/185.11

FOREIGN PATENT DOCUMENTS

JP    2002-057231    2/2002

* cited by examiner

*Primary Examiner*—Trong Phan
(74) *Attorney, Agent, or Firm*—Morrison & Foerster LLP

(57) ABSTRACT

A nonvolatile semiconductor storage device including: a plurality of memory cell unit groups each comprising one or more NAND nonvolatile memory cell units each comprising at least one memory cell having a control gate, a first selection transistor having a first selection gate, and a second selection transistor having a second selection gate, the memory cell unit groups each further comprising a control gate line connected to the control gate, a first selection gate line connected to the first selection gate, and a second selection gate line connected to the second selection gate; a common control gate line connected commonly to the control gate lines of different ones of the memory cell unit groups; a first common selection gate line connected commonly to the first selection gate lines of different ones of the memory cell unit groups; and a second common selection gate line connected commonly to the second selection gate lines of different ones of the memory cell unit groups; wherein the memory cells in the respective memory cell unit groups are each uniquely selected on the basis of a combination of the common control gate line and the first and second common selection gate lines.

5 Claims, 9 Drawing Sheets

NONVOLATILE SEMICONDUCTOR STORAGE DEVICE, AND LIQUID CRYSTAL DISPLAY DEVICE INCLUDING THE SAME

CROSS-REFERENCE TO RELATED APPLICATION

This application is related to Japanese application No. 2003-208875 filed on Aug. 26, 2003 whose priority is claimed under 35 USC § 119, the disclosure of which is incorporated by reference in its entirety.

BACKGROUND OF THE INVENTION

1. Field of the Invention

The present invention relates to a nonvolatile semiconductor storage device, and to a liquid crystal display device including the nonvolatile semiconductor storage device. More particularly, the invention relates to an interconnection arrangement of control gates and selection gates of NAND nonvolatile memory cell units in a nonvolatile semiconductor storage device.

2. Description of the Related Art

The recent advancement of the semiconductor technology, particularly, the development of a micro-processing technique and a three-dimensional processing technique (by which memory cells are stacked perpendicularly to a semiconductor substrate surface for increasing the number of memory cells provided in a semiconductor storage device), makes it possible to achieve the memory cell size reduction and capacity increase of a nonvolatile semiconductor storage device. There are various types of nonvolatile semiconductor storage devices which have different circuit configurations and functions. Among these nonvolatile semiconductor storage devices, flash EEPROMs (hereinafter referred to as "flash memories") are most widely used, particularly, for large storage capacity applications. The flash memories are roughly classified into a NOR type and a NAND type. The NOR flash memory includes one transistor per cell, while the NAND flash memory includes a plurality of memory cell transistors arranged in series and selection transistors provided at opposite ends of the cell arrangement. In the NAND flash memory, a bit line contact and a source line contact are shared by the plurality of memory cell transistors, so that a memory cell area is reduced. Therefore, the NAND flash memory having a smaller memory cell area is suitable for the large storage capacity applications. The NOR flash memory generally performs a programming operation by utilizing channel hot electrons, and performs an erasing operation by utilizing FN tunneling. In the programming operation, voltages of about 10V, about 0V and about 6V are applied to a control gate, a source and a drain, respectively. In the erasing operation, voltages of about −10V and about 5V are applied to the control gate and a P well, respectively, and the source and the drain are opened. On the other hand, the NAND flash memory performs a programming operation and an erasing operation by utilizing FN tunneling. In the programming operation, a voltage of about 20V is applied to a control gate, and a voltage of about 0V is applied to a source and a drain. In the programming operation, a voltage of about −20V is applied to the control gate, and about 0V is applied to the source and the drain. Since the FN tunneling is utilized for the programming operation in the NAND flash memory, the NAND flash memory requires application of higher voltages than the NOR flash memory (see, for example, Flash Memory Technology Handbook authored by Fujio Masuoka and published by Science Forum, Aug. 1993).

FIG. 9 is a block diagram illustrating memory blocks of the prior art NAND flash memory including memory cell units by way of example. A memory cell selecting operation to be performed by the prior art NAND flash memory will be described with reference to FIG. 9.

As shown in FIG. 9, the flash memory 100 includes four memory blocks 101, 102, 103, 104 each including four memory cell unit groups. The memory cell unit groups each include four memory cell units each including two memory cells. Sixteen selection gate lines SG1a to SG1p (any one of which is designated as "SG1"), sixteen selection gate lines SG2a to SG2p (any one of which is designated as "SG2"), sixteen control gate lines CG1a to CG1p (any one of which is designated as "CG1") and sixteen control gate lines CG2a to CG2p any one of which is designated as "CG2") are provided for driving selection gates and control gates of the memory cell units. For uniquely selecting each of the memory cells, SG1 decoders 105aSG1 to 108pSG1 and SG2 decoders 105aSG2 to 108pSG2 are respectively provided for the selection gate lines SG1a to SG1p and the selection gate lines SG2a to SG2p, and CG1 decoders 105aCG1 to 108pCG1 and CG2 decoders 105aCG2 to 108pCG2 are respectively provided for the control gate lines CG1a to CG1p and the control gate lines CG2a to CG2p. Four bit lines BLa to BLd are connected to the selection gate lines SG1a to SG1p, SG2a to SG2p and the control gate lines CG1a to CG1p, CG2a to CG2p in an intersecting manner. The bit lines BLa to BLd extend through all the blocks, and are respectively connected to drains of the memory cell units in each of the memory cell unit groups in each of the memory blocks.

When an address signal A[4:1], i.e., four address signals A4 to A1, is inputted to a predecoder 113 from an external pad, the predecoder 113 selects one of four SG2-decoder selection signals SSGD2a to SSGD2d and one of four CG2-decoder selection signals SCGD2a to SCGD2d on the basis of the address signals A4 and A3, and selects one of four SG1-decoder selection signals SSGD1a to SSGD1d and one of four CG1-decoder selection signals SCGD1a to SCGD1d on the basis of the address signals A2 and A1. More specifically, the predecoder 113 selects the signals SSGD2a, SCGD2a where A4=0 and A3=0. The predecoder 113 selects the signals SSGD2b, SCGD2b where A4=0 and A3=1. The predecoder 113 selects the signals SSGD2c, SCGD2c where A4=1 and A3=0. The predecoder 113 selects the signals SSGD2d, SCGD2d where A4=1 and A3=1. The predecoder 113 selects the signals SSGD1a, SCGD1a where A2=0 and A1=0. The predecoder 113 selects the signals SSGD1b, SCGD1b where A2=0 and A1=1. The predecoder 113 selects the signals SSGD1c, SCGD1c where A2=1 and A1=0. The predecoder 113 selects the signals SSGD1d, SCGD1d where A2=1 and A1=1.

When the signals SSGD2a, SCGD2a are selected, circuits of an SG2 decoder 109SG2 and an SG1 decoder 109SG1 in a decoder group 109 are turned on, and circuits of a CG2 decoder 109CG2 and a CG1 decoder 109CG1 in the decoder group 109 are turned on. Similarly, when the signals SSGD2b, SCGD2b are selected, circuits of an SG2 decoder 110SG2 and an SG1 decoder 110SG1 in a decoder group 110 are turned on, and circuits of a CG2 decoder 110CG2 and a CG1 decoder 110CG1 in the decoder group 110 are turned on. When the signals SSGD2c, SCGD2c are selected, circuits of an SG2 decoder 111SG2 and an SG1 decoder 111SG1 in a decoder group 111 are turned on, and circuits of a CG2 decoder 111CG2 and a CG1 decoder 111CG1 in the decoder group 111 are turned on. When the signals SSGD2d, SCGD2d are selected, circuits of an SG2 decoder 112SG2 and an SG1 decoder 112SG1 in a decoder group 112 are turned on, and circuits of a CG2 decoder 112CG2 and a CG1 decoder 112CG1 in the decoder group 112 are turned on.

When the signals SSGD1a, SCGD1a are selected, an SG2 decoder 105aSG2, an SG1 decoder 105aSG1, a CG2 decoder 105aCG2 and a CG1 decoder 105aCG1 in a decoder group 105 are turned on. When the signals SSGD1b, SCGD1a are selected, an SG2 decoder 105bSG2, an SG1 decoder 105bSG1, a CG2 decoder 105bCG2 and a CG1 decoder 105bCG1 in the decoder group 105 are turned on. When the signals SSGD1c, SCGD1c are selected, an SG2 decoder 105cSG2, an SG1 decoder 105cSG1, a CG2 decoder 105cCG2 and a CG1 decoder 105cCG1 in the decoder group 105 are turned on. When the signals SSGD1d, SCGD1d are selected, an SG2 decoder 105dSG2, an SG1 decoder 105dSG1, a CG2 decoder 105dCG2 and a CG1 decoder 105dCG1 in the decoder group 105 are turned on.

Further, where an address signal A0=0 is inputted, the control gate lines connected to the CG1 decoders are selected. Where an address signal A0=1 is inputted, the control gate lines connected to the CG2 decoders are selected.

Next, an explanation will be given to a memory cell selecting operation to be performed when an address signal A[4:0]=00000 is inputted. The predecoder 113 selects the signals SSGD2a, SCGD2a, SSGD1a and SCGD1a. Thus, the SG2 decoder 109SG2, the SG1 decoder 109SG1, the CG2 decoder 109CG2 and the CG1 decoder 109CG1 in the decoder group 109, and the SG2 decoder 105aSG2, the SG1 decoder 105aSG1, the CG2 decoder 105aCG2 and the CG1 decoder 105aCG1 in the decoder group 105 are turned on. Then, the selection gate lines SG2a, SG1a are selected. Since the address signal A0 is A0=0, the control gate line CG1a connected to the CG1 decoder 105aCG1 is selected. In a writing operation, a writing voltage generating circuit 114 is turned on by a writing enable signal WEN, whereby a writing voltage is applied to the decoders. Thus, voltages for the writing are respectively applied to the selected selection gate lines and control gate lines. In an erasing operation, an erasing voltage generating circuit 115 is turned on by an erasing enable signal EEN, whereby an erasing voltage is applied to the decoders. Thus, voltages for the erasing are respectively applied to the selected selection gate lines and control gate lines. Signals to be selected for respective status values of the address signals A0 to A4 are shown in Tables 1 to 3. Particularly, Table 1 shows selection signals to be applied to the decoder groups 109 to 112, and Table 2 shows selection signals to be applied to the decoder groups 105 to 108. Table 3 shows the selection gate lines SG2, SG1 and the control gate line CG to be selected.

TABLE 1

| A4 | A3 | Selection signals | |
|---|---|---|---|
| 0 | 0 | SSGD2a | SCGD2a |
| 0 | 1 | SSGD2b | SCGD2b |
| 1 | 0 | SSGD2c | SCGD2c |
| 1 | 1 | SSGD2d | SCGD2d |

TABLE 2

| A2 | A1 | Selection signals | |
|---|---|---|---|
| 0 | 0 | SSGD1a | SCGD1a |
| 0 | 1 | SSGD1b | SCGD1b |
| 1 | 0 | SSGD1c | SCGD1c |
| 1 | 1 | SSGD1d | SCGD1d |

TABLE 3

| A4 | A3 | A2 | A1 | Selected SG2 | Selected SG1 | Selected CG A0 = 1 | A0 = 0 |
|---|---|---|---|---|---|---|---|
| 0 | 0 | 0 | 0 | SG2a | SG1a | CG2a | CG1a |
|   |   | 0 | 1 | SG2b | SG1b | CG2b | CG1b |
|   |   | 1 | 0 | SG2c | SG1c | CG2c | CG1c |
|   |   | 1 | 1 | SG2d | SG1d | CG2d | CG1d |
| 0 | 1 | 0 | 0 | SG2e | SG1e | CG2e | CG1e |
|   |   | 0 | 1 | SG2f | SG1f | CG2f | CG1f |
|   |   | 1 | 0 | SG2g | SG1g | CG2g | CG1g |
|   |   | 1 | 1 | SG2h | SG1h | CG2h | CG1h |
| 1 | 0 | 0 | 0 | SG2i | SG1i | CG2i | CG1i |
|   |   | 0 | 1 | SG2j | SG1j | CG2j | CG1j |
|   |   | 1 | 0 | SG2k | SG1k | CG2k | CG1k |
|   |   | 1 | 1 | SG2l | SG1l | CG2l | CG1l |
| 1 | 1 | 0 | 0 | SG2m | SG1m | CG2m | CG1m |
|   |   | 0 | 1 | SG2n | SG1n | CG2n | CG1n |
|   |   | 1 | 0 | SG2o | SG1o | CG2o | CG1o |
|   |   | 1 | 1 | SG2p | SG1p | CG2p | CG1p |

However, the NAND flash EEPROM described above has a smaller memory cell area and a smaller area available for routing the word lines than the NOR flash EEPROM. The NAND flash memory utilized a higher writing voltage and a higher erasing voltage than the NOR flash memory, so that the size of each of the transistors should be increased. Therefore, the routing of interconnections between the memory cells and the word line decoders and the layout of the decoders become more difficult with the size reduction and capacity increase of the semiconductor device.

SUMMARY OF THE INVENTION

In view of the foregoing, the present invention is directed to a smaller-size and feasible nonvolatile semiconductor storage device which has a word line decoder arrangement and an interconnection arrangement that ensures easier layout of word line decoders and easier routing of interconnections between memory cells and the word line decoders.

According to the present invention, there is provided a nonvolatile semiconductor storage device, which comprises: a plurality of memory cell unit groups each comprising one or more NAND nonvolatile memory cell units each comprising at least one memory cell having a charge storage layer and a control gate, a first selection transistor disposed at one end of the memory cell and having a first selection gate, and a second selection transistor disposed at the other end of the memory cell and having a second selection gate, the memory cell unit groups each further comprising a control gate line connected to the control gate of the memory cell of each of the memory cell units, a first selection gate line connected to the first selection gate of the first selection transistor of each of the memory cell units, and a second selection gate line connected to the second selection gate of the second selection transistor of each of the memory cell units; a common control gate line connected commonly to the control gate lines of different ones of the memory cell unit groups; a first common selection gate line connected commonly to the first selection gate lines of different ones of the memory cell unit groups; and a second common selection gate line connected commonly to the second selection gate lines of different ones of the memory cell unit groups; wherein the memory cells in the respective memory cell unit groups are each uniquely selected on the basis of a combination of the common control gate line and the first and second common selection gate lines.

According to the present invention, the memory cells are each uniquely selected on the basis of a combination of the common control gate line and the first and second common selection gate lines. Therefore, the total number of word line decoders required for driving the control gate lines and the selection gate lines can be reduced. Hence, the total area of the word line decoders can be reduced, making the layout of the word line decoders easier.

DETAILED DESCRIPTION OF THE INVENTION

Figure 1:
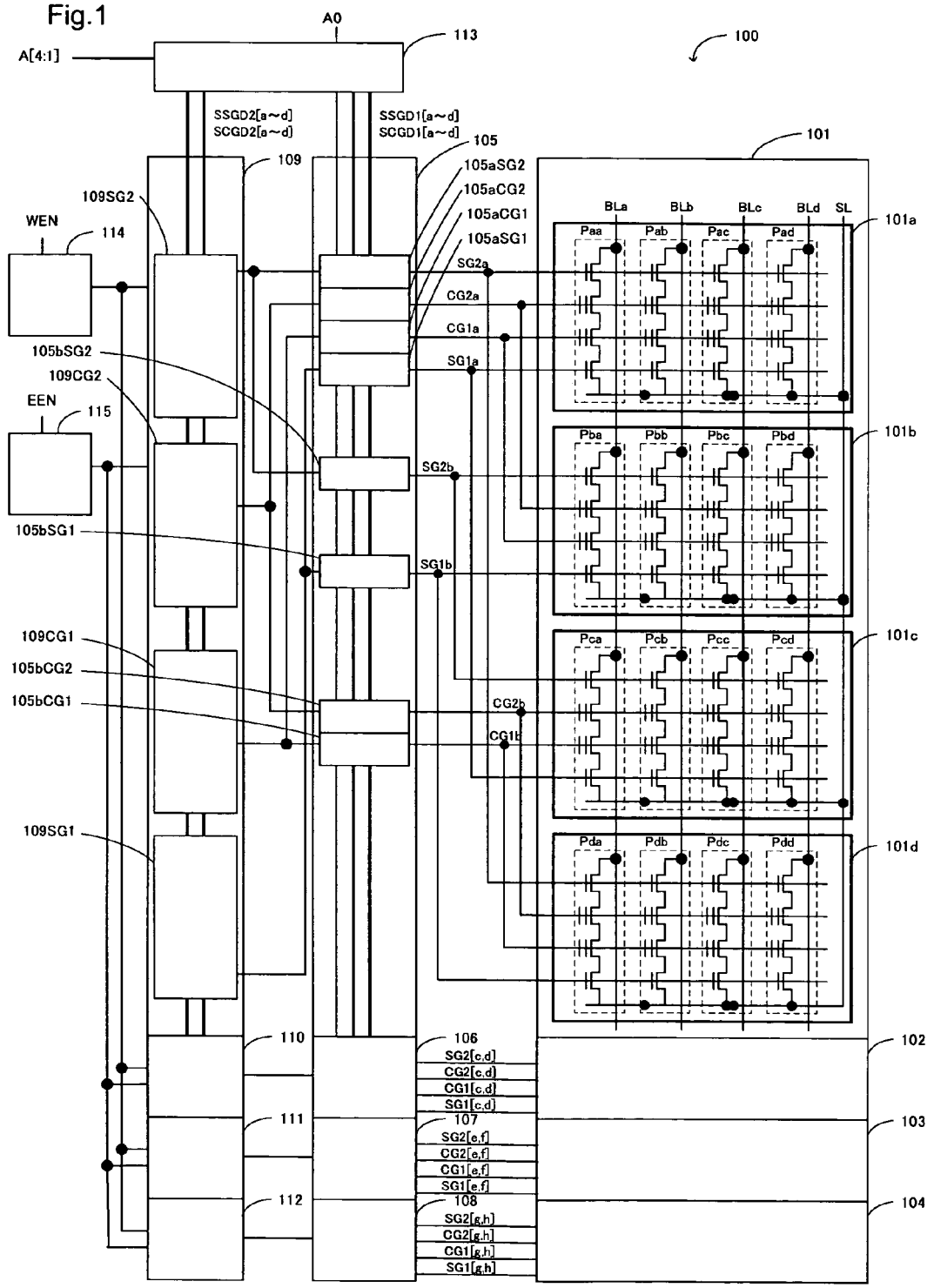
FIG. 1 is a block diagram illustrating memory blocks of a nonvolatile semiconductor storage device of the present invention.

In the inventive nonvolatile semiconductor storage device, NAND nonvolatile memory cell units are provided as a minimum arrangement unit. The memory cell units may be produced by forming memory cells on a surface of a semiconductor substrate by a known planar technique, or may be produced by stacking memory cells perpendicularly to a surface of a semiconductor substrate by a three-dimensional technique.

The nonvolatile semiconductor storage device comprises a plurality of memory cell unit groups. The memory cell unit groups each comprise one or more NAND nonvolatile memory cell units. The nonvolatile memory cell units each comprise at least one memory cell having a charge storage layer and a control gate, a first selection transistor disposed at one end of the memory cell and having a first selection gate, and a second selection transistor disposed at the other end of the memory cell and having a second selection gate.

The memory cell unit groups each further comprise a control gate line connected to the control gate of the memory cell of each of the memory cell units, a first selection gate line connected to the first selection gate of the first selection transistor of each of the memory cell units, and a second selection gate line connected to the second selection gate of the second selection transistor of each of the memory cell units. The nonvolatile semiconductor storage device further comprises a common control gate line connected commonly to the control gate lines of different ones of the memory cell unit groups, a first common selection gate line connected commonly to the first selection gate lines of different ones of the memory cell unit groups, and a second common selection gate line connected commonly to the second selection gate lines of different ones of the memory cell unit groups. The memory cell unit groups constitute a memory block, and a plurality of such memory blocks may be provided in the nonvolatile semiconductor storage device.

The memory cells in the respective memory cell unit groups are each uniquely selected on the basis of a combination of the common control gate line and the first and second common selection gate lines.

The at least one memory cell of each of the NAND nonvolatile memory cell units may include a plurality of memory cells arranged in series, and the control gate line of each of the memory cell unit groups may include a plurality of control gate lines, which are respectively connected to the control gates of the memory cells of each of the NAND nonvolatile memory cell units in each of the memory cell unit groups and are each connected commonly to the control gates of corresponding ones of the memory cells of the respective NAND memory cell units. The common control gate line may be connected commonly to the control gate lines of at least two of the memory cell unit groups selected in a first combination. The first common selection gate line may be connected commonly to the first selection gate lines of at least two of the memory cell unit groups selected in a second combination different from the first combination. The second common selection gate line may be connected commonly to the second selection gate lines of at least two of the memory cell unit groups selected in a third combination different from the first and second combinations. Thus, the memory cells in the memory cell unit groups are each uniquely selected on the basis of the combination of the common control gate line, the first common selection gate line and the second common selection gate line.

The number of the control gate lines of the respective memory cell unit groups connected to the common control gate line and the total number of the first and second selection gate lines of the respective memory cell unit groups connected to the first and second common selection gate lines may each be $2^k$ ($k \geq 1$).

If k is greater than 1, the total number of word line decoders can further be reduced. Therefore, the total area of the word line decoders can further be reduced, making the layout of the word line decoders further easier.

The common control gate line and the first and second common selection gate lines may be routed symmetrically in each two adjacent memory cell unit groups, and word line decoders are alternately arranged on opposite sides of the respective memory blocks.

With this arrangement, the alternate arrangement of the word line decoders on the opposite sides of the memory blocks makes it possible to arrange the decoders at a pitch equivalent to the pitch of the memory cell unit groups, so that the layout of the decoders and the routing of interconnections between the memory cells and the word line decoders can be achieved with a sufficient margin. This makes the layout of the word line decoders further easier.

According to another aspect of the present invention, there is provided a liquid crystal display device comprising the semiconductor storage device described above.

DESCRIPTION OF THE PREFERRED EMBODIMENTS

The present invention will hereinafter be described in detail by way of embodiments thereof. It should be noted that the invention be not limited to the embodiments.

First Embodiment

Figure 9:
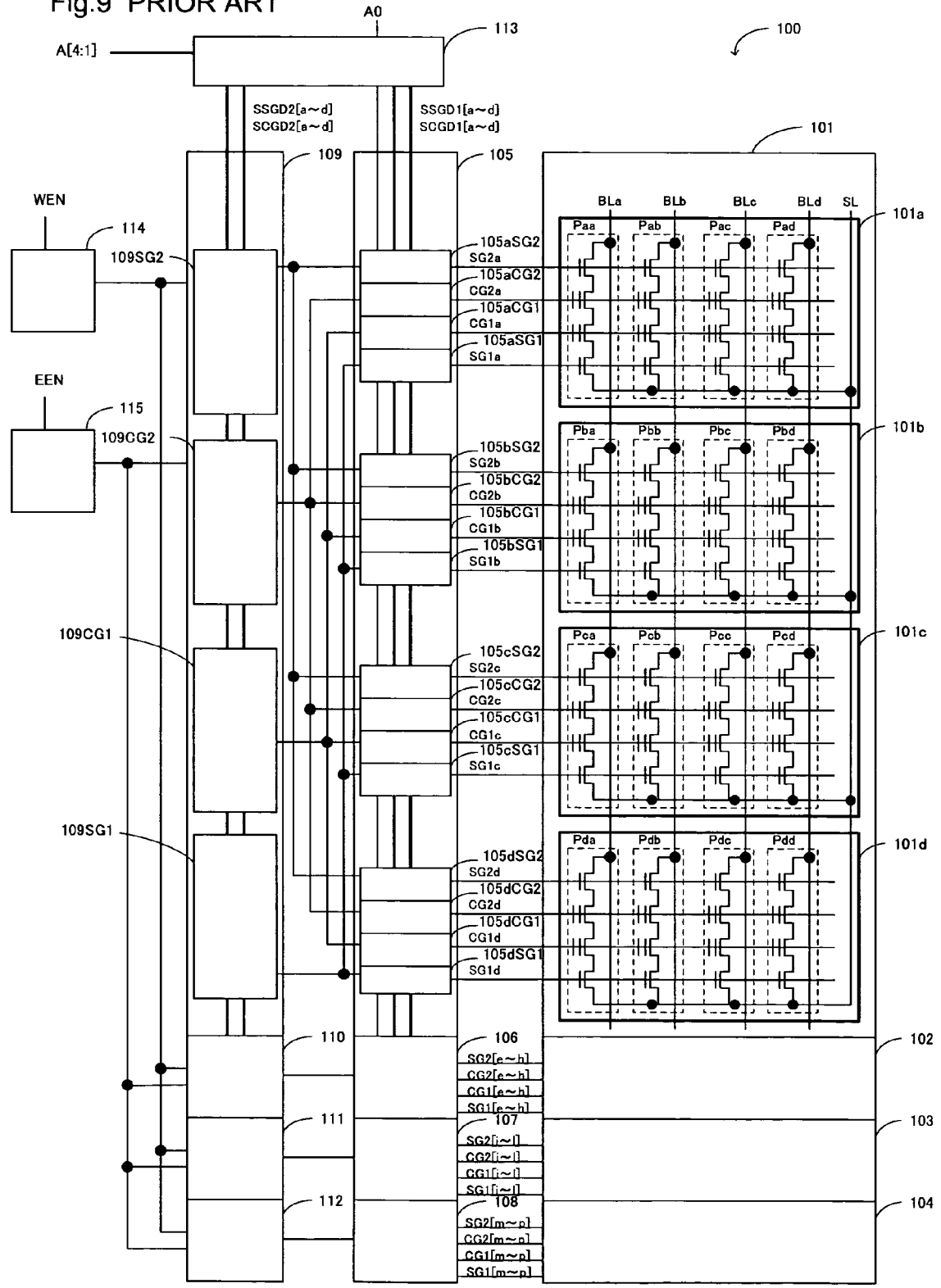
FIG. 9 is a block diagram illustrating memory blocks of the prior art NAND flash memory including memory cell units by way of example.

FIG. 9 is a block diagram illustrating memory blocks of the prior art NAND flash memory including memory cell units by way of example. In FIG. 1, components corresponding to those of the prior art memory blocks shown in FIG. 9 will be denoted by the same reference characters as in FIG. 9. With reference to FIG. 1, an explanation will be given to a memory cell selecting operation.

As shown in FIG. 1, a flash memory 100 includes four memory blocks 101, 102, 103, 104 each including four memory cell unit groups. The memory cell unit groups each include N memory cell units (N: a positive integer, four memory cell units in this embodiment) each including two memory cells. Eight common selection gate lines (selection gate lines) SG1a to SG1h (any one of which is designated as "SG1"), eight common selection gate lines (selection gate lines) SG2a to SG2h (any one of which is designated as "SG2"), eight common control gate lines (control gate lines) CG1a to CG1h (any one of which is designated as "CG1") and eight common control gate lines (control gate lines) CG2a to CG2h (any one of which is designated as "CG2") are provided for driving selection gates and control gates of the memory cell units. For uniquely selecting each of the memory cells, SG1 decoders 105aSG1 to 108hSG1 and SG2 decoders 105aSG2 to 108hSG2 are respectively provided for the selection gate lines SG1a to SG1h and SG2a to SG2h, and CG1 decoders 105aCG1 to 108hCG1 and CG2 decoders 105aCG2 to 108hCG2 are respectively provided for the control gate lines CG1a to CG1h and CG2a to CG2h. Further, N bit lines (four bit lines BLa to BLd in this embodiment) are connected to the selection gate lines and the control gate lines in an intersecting manner. The bit lines BLa to BLd extend through all the blocks, and are respectively connected to drain terminals of the memory cell units in each of the memory cell unit groups in each of the memory blocks.

The control gate lines CG1a and CG2a are respectively connected to control gates of the two memory cells of each of the N memory cell units in the memory cell unit group 101a, and further respectively connected to control gates of the two memory cells of each of the N memory cell units in the memory cell unit group 101b. Similarly, the control gate lines CG1b and CG2b are respectively connected to control gates of the two memory cells of each of the N memory cell units in the memory cell unit group 101c, and further respectively connected to control gates of the two memory cells of each of the N memory cell units in the memory cell unit group 101d in the memory block 101. On the other hand, the selection gate line SG1a is connected to one of two selection gates of each of the N memory cell units in the memory cell unit group 101a and to one of two selection gates of each of the N memory cell units in the memory cell unit group 101c. The selection gate line SG1b is connected to one of two selection gates of each of the N memory cell units in the memory cell unit group 101b and to one of two selection gates of each of the N memory cell units in the memory cell unit group 101d. The selection gate line SG2a is connected to the other selection gate of each of the N memory cell units in the memory cell unit group 101a and to the other selection gate of each of the N memory cell units in the memory cell unit group 101d. The selection gate line SG2b is connected to the other selection gate of each of the N memory cell units in the memory cell unit group 101b and to the other selection gate of each of the N memory cell units in the memory cell unit group 101c. In the other memory blocks, connection of the control gate lines and the selection gate lines is achieved in the same manner as described above. The first embodiment of the present invention has a feature such that the control gate lines CG1, CG2 and the selection gate lines SG1, SG2 are shared by different combinations of the memory cell unit groups. Although the eight selection gate lines, the eight control gate lines and the decoders for the selection gate lines and the control gate lines are provided for each of the memory blocks in the prior art nonvolatile semiconductor storage device, the four selection gate lines and the four control gate lines are provided for each of the memory blocks according to the first embodiment. Therefore, the numbers of CG1 decoders, CG2 decoders, SG1 decoders and SG2 decoders are reduced by half as compared with the prior art.

As described above, the memory blocks 101, 102, 103, 104 each include the four memory cell unit groups as shown in FIG. 1. For example, the memory block 101 includes four memory cell unit groups 101a, 101b, 101c, 101d. Although the flash memory shown in FIG. 1 includes the four memory blocks 101, 102, 103, 104, the number of the memory blocks may be increased according to a required storage capacity. The number N of the memory cell units provided in each of the memory cell unit groups, i.e., the number N of the bit lines, is N=4, but may be changed as required. The total number of the memory cells in each of the memory cell unit groups may also be changed as required.

The selection of signals by the predecoder 113 and the selection of decoders in a decoder group 109 are achieved in the same manner as in the prior art shown in FIG. 9. Signals SSGD1a, SCGD1a selected by the predecoder 113 turn on an SG2 decoder 105aSG2, an SG1 decoder 105aSG1, a CG2 decoder 105aCG2 and a CG1 decoder 105aCG2 in a decoder group 105. Signals SSGD1b, SCGD1b selected by the predecoder 113 turn on an SG2 decoder 105bSG2, an SG1 decoder 105bSG1, the CG2 decoder 105aCG2 and the CG1 decoder 105aCG1 in the decoder group 105. Signals SSGD1c, SCGD1c selected by the predecoder 113 turn on the SG2 decoder 105bSG2, the SG1 decoder 105aSG1, a CG2 decoder 105bCG2 and a CG1 decoder 105bCG1 in the decoder group 105. Signals SSGD1d, SCGD1d selected by the predecoder 113 turn on the SG2 decoder 105aSG2, the SG1 decoder 105bSG1, the CG2 decoder 105bCG2 and the CG1 decoder 105bCG1 in the decoder group 105.

An explanation will be given to a memory cell selecting operation to be performed when an address signal A[4:0]=00000 is inputted. Signals SSGD2a, SCGD2a, SSGD1a, SCGD1a are first selected by the predecoder 113. Thus, an SG2 decoder 109SG2, an SG1 decoder 109SG1, a CG2 decoder 109CG2 and a CG1 decoder 109CG1 in the decoder group 109, and the SG2 decoder 105aSG2, the SG1 decoder 105aSG1, the CG2 decoder 105aCG2 and the CG1 decoder 105aCG1 in the decoder group 105 are turned on. Then, the selection gate lines SG2a, SG1a are selected. Since an address signal A0 is A0=0, the control gate line CG1a connected to the CG1 decoder 105aCG1 is selected. In the writing operation, a writing voltage generating circuit 114 is turned on by a writing enable signal WEN, whereby a writing voltage is applied to the decoders. Thus, voltages for the writing are respectively applied to the selected selection gate lines and the selected control gate line. In the erasing operation, an erasing voltage generating circuit 115 is turned on by an erasing enable signal EEN, whereby an erasing voltage is applied to the decoders. Thus, voltages for the erasing are respectively applied to the selected selection gate lines and the selected control gate line.

Where the selection gate lines and the control gate lines are each shared by two of the memory cell unit groups according to this embodiment, the number of the decoders in the decoder group 105 can be reduced by half as compared with the prior art. Table 4 shows the selection gate lines SG2, SG1 and the control gate line CG to be selected for respective status values of the address signals A0 to A4.

TABLE 4

| | | | | | | Selected CG | |
|---|---|---|---|---|---|---|---|
| A4 | A3 | A2 | A1 | Selected SG2 | Selected SG1 | A0 = 1 | A0 = 0 |
| 0 | 0 | 0 | 0 | SG2a | SG1a | CG2a | CG1a |
| | | 0 | 1 | SG2b | SG1b | CG2a | CG1a |
| | | 1 | 0 | SG2b | SG1a | CG2b | CG2b |
| | | 1 | 1 | SG2a | SG1b | CG2b | CG2b |
| 0 | 1 | 0 | 0 | SG2e | SG1e | CG2e | CG1e |
| | | 0 | 1 | SG2f | SG1f | CG2e | CG1e |
| | | 1 | 0 | SG2f | SG1e | CG2f | CG1f |
| | | 1 | 1 | SG2e | SG1f | CG2f | CG1f |
| 1 | 0 | 0 | 0 | SG2i | SG1i | CG2i | CG1i |
| | | 0 | 1 | SG2j | SG1j | CG2i | CG1i |
| | | 1 | 0 | SG2j | SG1i | CG2j | CG1j |
| | | 1 | 1 | SG2i | SG1j | CG2j | CG1j |
| 1 | 1 | 0 | 0 | SG2m | SG1m | CG2m | CG1m |
| | | 0 | 1 | SG2n | SG1n | CG2m | CG1m |
| | | 1 | 0 | SG2n | SG1m | CG2n | CG1n |
| | | 1 | 1 | SG2m | SG1n | CG2n | CG1n |

Second Embodiment

Figure 2:
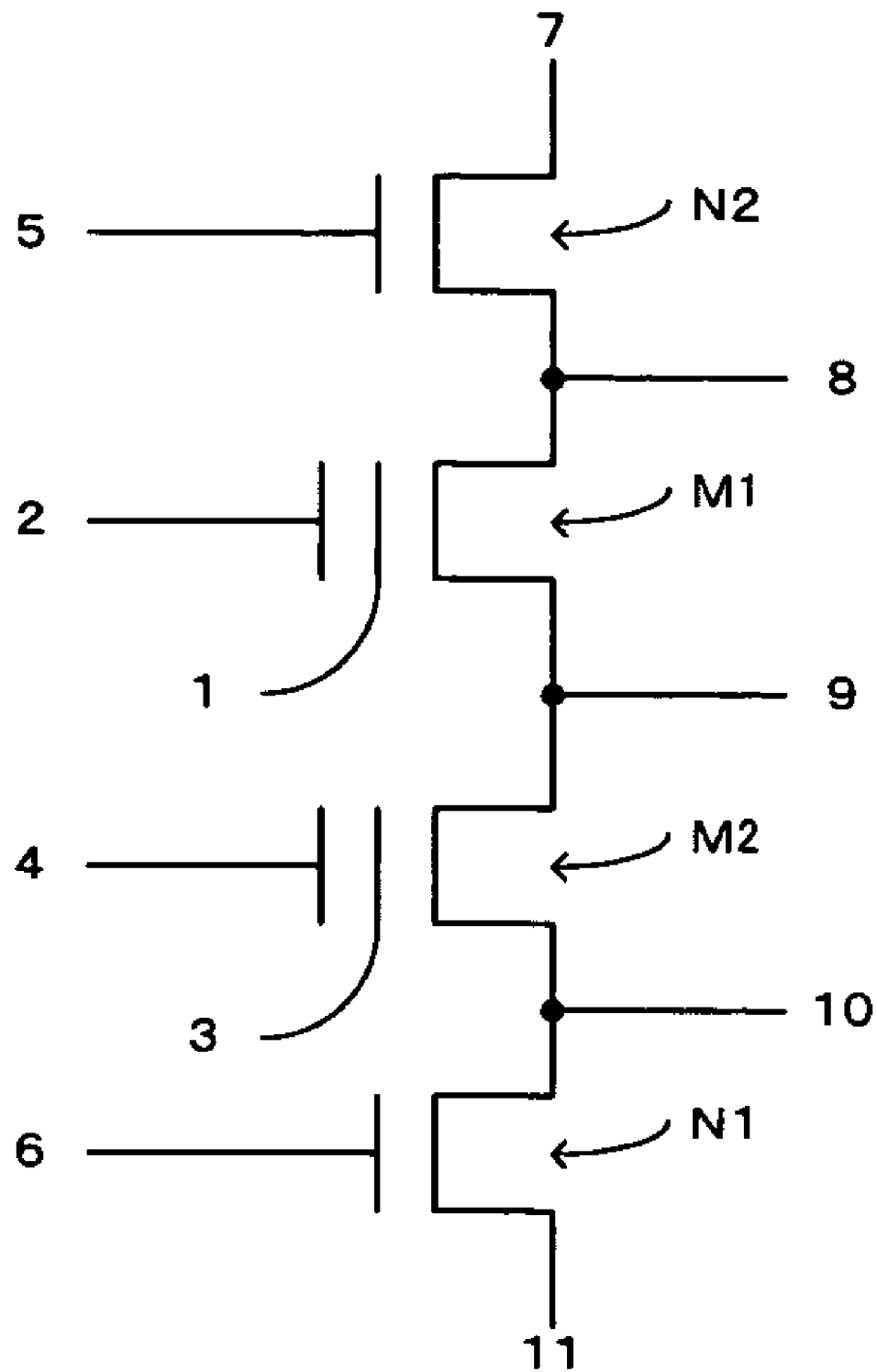
FIG. 2 is an equivalent circuit diagram of the NAND memory cell unit in FIG. 1.

An explanation will be given to a reading operation to be performed on each of the memory cell units provided in the nonvolatile semiconductor storage device. FIG. 2 is an equivalent circuit diagram of the NAND memory cell unit. Where data is to be read out of an upper memory cell M1 of each of the NAND memory cell units Paa to Pad in the memory cell unit group 101a in the memory block 101 shown in FIG. 1, the selection gate lines SG1a, SG2a and the control gate line CG2a are selected, and the selection gate lines SG1b, SG2b and the control gate lines CG1a, CG1b, CG2b are not selected. Then, the control gate line CG2a (control gate 2 in FIG. 2) is grounded, and a positive voltage V1 is applied to the control gate line CG1a (control gate 4 in FIG. 2), the selection gate line SG2a (selection gate 5 in FIG. 2) and the selection gate line SG1a (selection gate 6 in FIG. 2). Further, a source line SL (source terminal 11 in FIG. 2) is grounded, and a positive voltage V2 is applied to the bit line BLa to BLd (drain terminal 7 in FIG. 2). Thus, the selection gates 5, 6 respectively connected to the selection gate lines SG2a, SG1a are turned on, and the control gate 4 is turned on by the unselected control gate line CG1a, whereby an electric current path can be established between the drain terminal 7 and the source terminal 11. If the threshold voltage of the selected memory cell M1 is within a negative voltage threshold distribution range (data "1"), an electric current flows between the drain terminal 7 and the source terminal 11, so that the voltage level of the bit line is reduced. At this time, the reduction of the voltage level of the bit line is sensed by a sense amplifier, and it is judged that the stored data is "1". On the other hand, if the threshold voltage of the selected memory cell M1 is within a positive voltage threshold distribution range (data "0"), no electric current flows between the drain terminal 7 and the source terminal 11, so that the voltage level of the bit line is kept unchanged. At this time, the voltage level of the bit line is sensed by the sense amplifier, and it is judged that the stored data is "0".

Where data is to be read out of a lower memory cell M2 of each of the NAND memory cell units Paa to Pad in the memory cell unit group 101a in the memory block 101, the selection gate lines SG1a, SG2a and the control gate line CG1a are selected, and the selection gate lines SG1b, SG2b and the control gate lines CG2a, CG1b, CG2b are not selected. Then, the control gate line CG1a (control gate 4 in FIG. 2) is grounded, and a positive voltage V1 is applied to the control gate line CG2a (control gate 2 in FIG. 2), the selection gate line SG2a (selection gate 5 in FIG. 2) and the selection gate line SG1a (selection gate 6 in FIG. 2). Further, the source line SL (source terminal 11) is grounded, and a positive voltage V2 is applied to the bit line (drain terminal 7). Thus, the selection gates 5, 6 respectively selected by the selection gate lines SG2a, SG1a are turned on, and the control gate 2 is turned on by the unselected control gate line CG2a, whereby an electric current path is established between the drain terminal 7 and the source terminal 11. Judgment on the data is made in the same manner as in the case where the data is read out of the upper memory cell M1.

In this manner, the reading operation is performed on the memory cells M1, M2 in the memory cell unit group 101a. At this time, the NAND memory cell unit group 101b (Pba to Pbd) which shares the control gate lines CG1a, CG2a with the NAND memory cell unit group 101a does not influence the reading operation, because the selection gate lines SG1b, SG2b are not selected and, hence, are grounded. The NAND memory cell unit group 101c (Pca to Pcd) which shares the selection gate line SG1a with the NAND memory cell unit group 101a does not influence the reading operation, because the control gate lines CG1b, CG2b and the selection gate line SG2b are not selected and, hence, are grounded. The NAND memory cell unit group 101d (Pda to Pdd) which shares the selection gate line SG2a with the NAND memory cell unit group 101a does not influence the reading operation, because the control gate lines CG1b, CG2b and the selection gate line SG1b are not selected and, hence, are grounded. Thus, there is no possibility that multiple selection occurs due to the sharing of the selection gate lines and the control gate lines.

For the reading from the memory cell unit group 101b (Pba to Pbd), the selection gate line SG1b and SG2b and the control gate line CG1a or CG2a are selected, and the selection gate line SG1a and SG2a and the control gate lines CG1b, CG2b are not selected. For the reading from the memory cell unit group 101c (Pca to Pcd), the selection gate lines SG1a and SG2b and the control gate line CG1b or CG2b are selected, and the selection gate lines SG1b and SG2a and the control gate lines CG1a and CG2a are not selected. For the reading from the memory cell unit group 101d (Pda to Pdd), the selection gate lines SG1b and SG2a and the control gate line CG1b or CG2b are selected, and the selection gate lines SG1a and SG2b and the control gate lines CG1a and CG2a are not selected.

Figure 3:
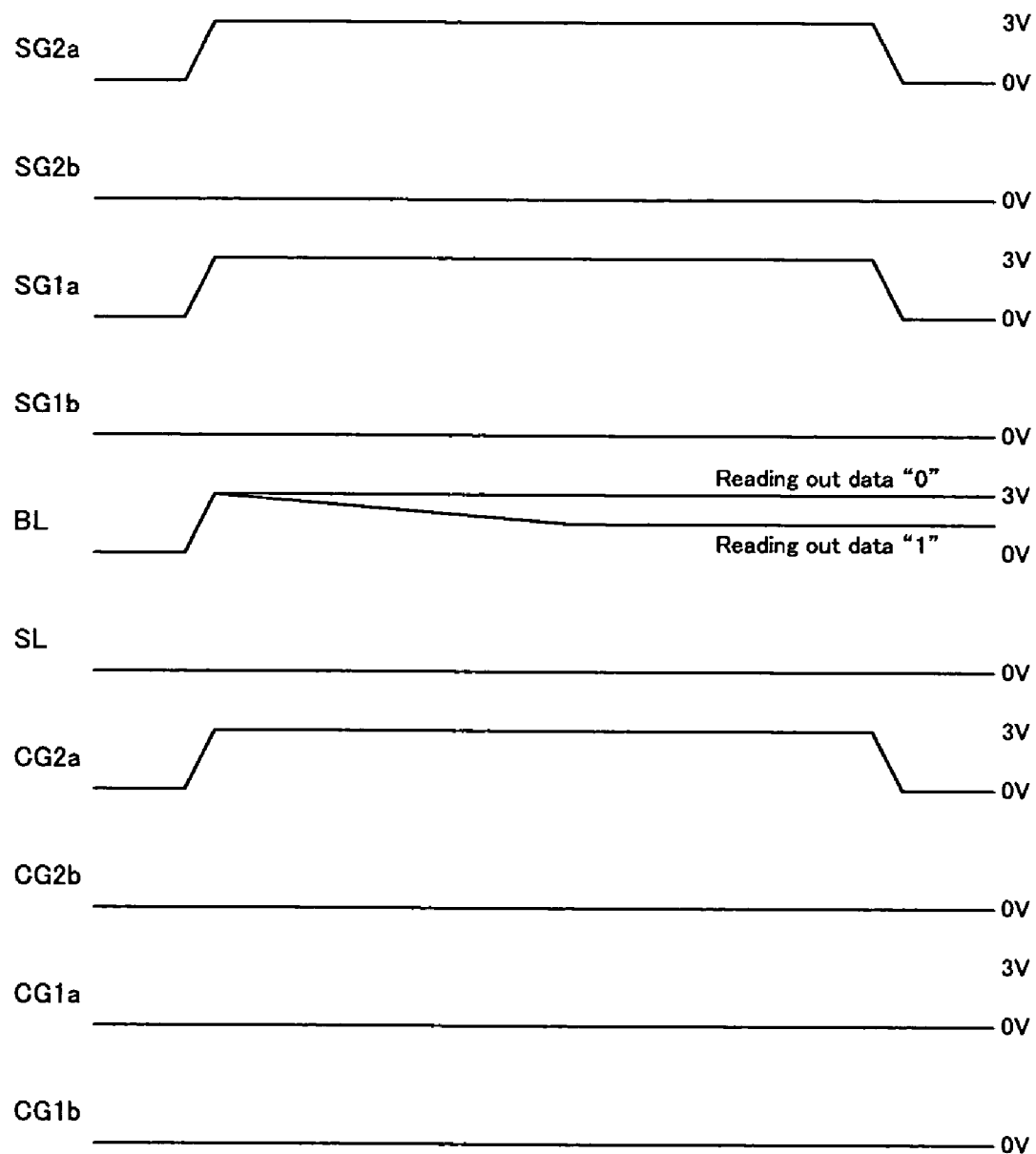
FIG. 3 is a timing chart for application of voltages for the reading operation according to the second embodiment of the present invention.

A timing chart for application of voltages for the reading operation according to the second embodiment is shown in FIG. 3. According to the timing chart shown in FIG. 3, data is read out of the NAND memory cell unit group 101*a* (Paa to Pad) connected to the control gate line CG1*a*. First, 0V is applied to the control gate lines CG1*a*, CG2*a*, the selection gate lines SG2*a*, SG1*a*, the source line SL and the bit line BL. Then, 3V is applied to the bit line BL, the selection gate lines SG2*a*, SG1*a*, and the control gate line CG2*a*. The control gate line CG1*a* is kept at 0V. Thus, data is read out of the memory cell unit group 101*a*. Where the reading operation is thereafter finished, 0V is applied to the selection gate lines SG2*a*, SG1*a*, the control gate line CG2*a* and the bit line BL in a reverse order. In FIG. 3, the voltages applied to the control gate line, the selection gate lines and the bit line are simultaneously changed. However, these voltages are not necessarily required to be simultaneously changed, but may be changed in a time-staggered manner.

Third Embodiment

Where electrons are to be injected selectively into charge storage layers 1 of the upper memory cells M1 of the memory cell units Paa to Pad in the memory cell unit group 101*a* by an FN tunnel current for a writing operation, the selection gate line SG2*a* and the control gate line CG2*a* are selected, and the selection gate lines SG1*a*, SG1*b*, SG2*b* and the control gate lines CG1*a*, CG1*b*, CG2*b* are not selected. A high voltage VH1 is first applied to the control gate line CG2*a* (control gate 2 in FIG. 2), and a voltage VH2 (VH1>VH2) such as to prevent the writing is applied to the control gate line CG1*a* (control gate 4 in FIG. 2). A positive voltage VH3 is applied to the selection gate line SG2*a* (selection gate 5 in FIG. 2), and the selection gate line SG1*a* (selection gate 6 in FIG. 2) and the source line SL (source terminal 11 in FIG. 2) are grounded. Further, a bit line (drain terminal 7 in FIG. 2) of a memory cell unit to be subjected to electron injection is grounded. For the other memory cell units not subjected to the electron injection in the selected memory cell unit group, a positive voltage is applied to bit lines connected to the memory cell units for prevention of the writing. In this manner, the selection gate 5, the control gate 4 and the control gate 2 are turned on by the selection gate line SG2*a*, the control gate line CG1*a* and the control gate line CG2*a*, respectively, and the writing bit line (drain terminal 7) is grounded. Thus, a channel associated with the control gate 2 is maintained at a ground level GR, whereby a potential difference VH1-GR occurs between the control gate 2 and the channel. At this time, electrons are injected into the charge storage layer 1 from the channel by the tunnel current. Thus, the threshold voltage of the memory cell M1 is positively shifted by the injection of the electrons. Since the writing prevention voltage VH2 is applied to the control gate 4 of the memory cell M2, the threshold voltage of the memory cell M2 is not changed even with the channel kept at the ground level.

Where electrons are to be injected selectively into charge storage layers 3 of the lower memory cells M2 of the memory cell units Paa to Pad in the memory cell unit group 101*a*, a high voltage VH1 is applied to the control gate line CG1*a* (control gate 4 in FIG. 2), and a voltage VH2 (VH1>VH2) such as to prevent the writing is applied to the control gate line CG2*a* (control gate 2 in FIG. 2). A positive voltage VH3 is applied to the selection gate line SG2*a* (selection gate 5 in FIG. 2), and the selection gate line SG1*a* (selection gate 6 in FIG. 2) and the source line SL (source terminal 11 in FIG. 2) are grounded. Further, a bit line (drain terminal 7 in FIG. 2) of a memory cell unit to be subjected to electron injection is grounded. For the other memory cell units not subjected to the electron injection in the selected memory cell unit group, a positive voltage is applied to bit lines connected to the memory cell units for prevention of the writing. In this manner, the selection gate 5, the control gate 4 and the control gate 2 are turned on by the selection gate line SG2*a*, the control gate line CG1*a* and the control gate line CG2*a*, respectively, and the writing bit line (drain terminal 7) is grounded. Thus, channels associated with the control gates 2, 4 are maintained at a ground level GR, whereby a potential difference VH1-GR occurs between the control gate 4 and the channel associated with the control gate 4. At this time, electrons are injected into the charge storage layer 3 from the channel by the tunnel current. Thus, the threshold voltage of the memory cell M2 is positively shifted by the injection of the electrons. Since the writing prevention voltage VH2 is applied to the control gate 2 of the memory cell M1, the threshold voltage of the memory cell M1 is not changed even with the channel kept at the ground level.

As for the memory cell unit group 101*b* (Pba to Pbd) which shares the control gate lines CG1*a*, CG2*a* with the memory cell unit group 101*a*, the selection gate line SG2*b* is not selected and, hence, is grounded. Although a high voltage is applied to the control gates of the memory cells of the memory cell units Pba to Pbd through the control gate lines CG1*a*, CG2*a*, the selection transistors are turned off with the selection gate line SG2*b* being grounded. Therefore, the channels of the memory cells are kept at a higher voltage by a coupling capacitance occurring between the channels and the control gates, so that the threshold voltages of the memory cells are not changed.

As for the memory cell unit group 101*c* (Pca to Pcd) which shares the selection gate line SG1*a* with the memory cell unit group 101*a*, the control gate lines CG1*b*, CG2*b* and the selection gate line SG2*b* are not selected and, hence, are grounded. Therefore, the writing operation is not performed on the memory cell unit group 101*c*. As for the memory cell unit group 101*d* (Pda to Pdd) which shares the selection gate line SG2*a* with the memory cell unit group 101*a*, the control gate lines CG1*b*, CG2*b* and the selection gate line SG1*b* are not selected and, hence, are grounded. Therefore, the writing operation is not performed on the memory cell unit group 101*d*.

Thus, there is no possibility that multiple selection occurs due to the sharing of the selection gate lines and the control gate lines.

Where the writing operation is to be performed on the NAND memory cell unit group 101*b* (Pba to Pbd), the selection gate line SG2*b* and the control gate line CG1*a* or CG2*a* are selected, and the selection gate lines SG1*a*, SG1*b*, SG2*a* and the control gate lines CG1*b*, CG2*b* are not selected.

Where the writing operation is to be performed on the NAND memory cell unit group 101*c* (Pca to Pcd), the selection gate line SG2*b* and the control gate line CG1*b* or CG2*b* are selected, and the selection gate lines SG1*a*, SG1*b*, SG2*a* and the control gate lines CG1*a*, CG2*a* are not selected.

Where the writing operation is to be performed on the NAND memory cell unit group 101*d* (Pda to Pdd), the selection gate line SG2*a* and the control gate line CG1*b* or CG2*b* are selected, and the selection gate lines SG1*a*, SG1*b*, SG2*b* and the control lines CG1*a*, CG2*a* are not selected.

Figure 4:
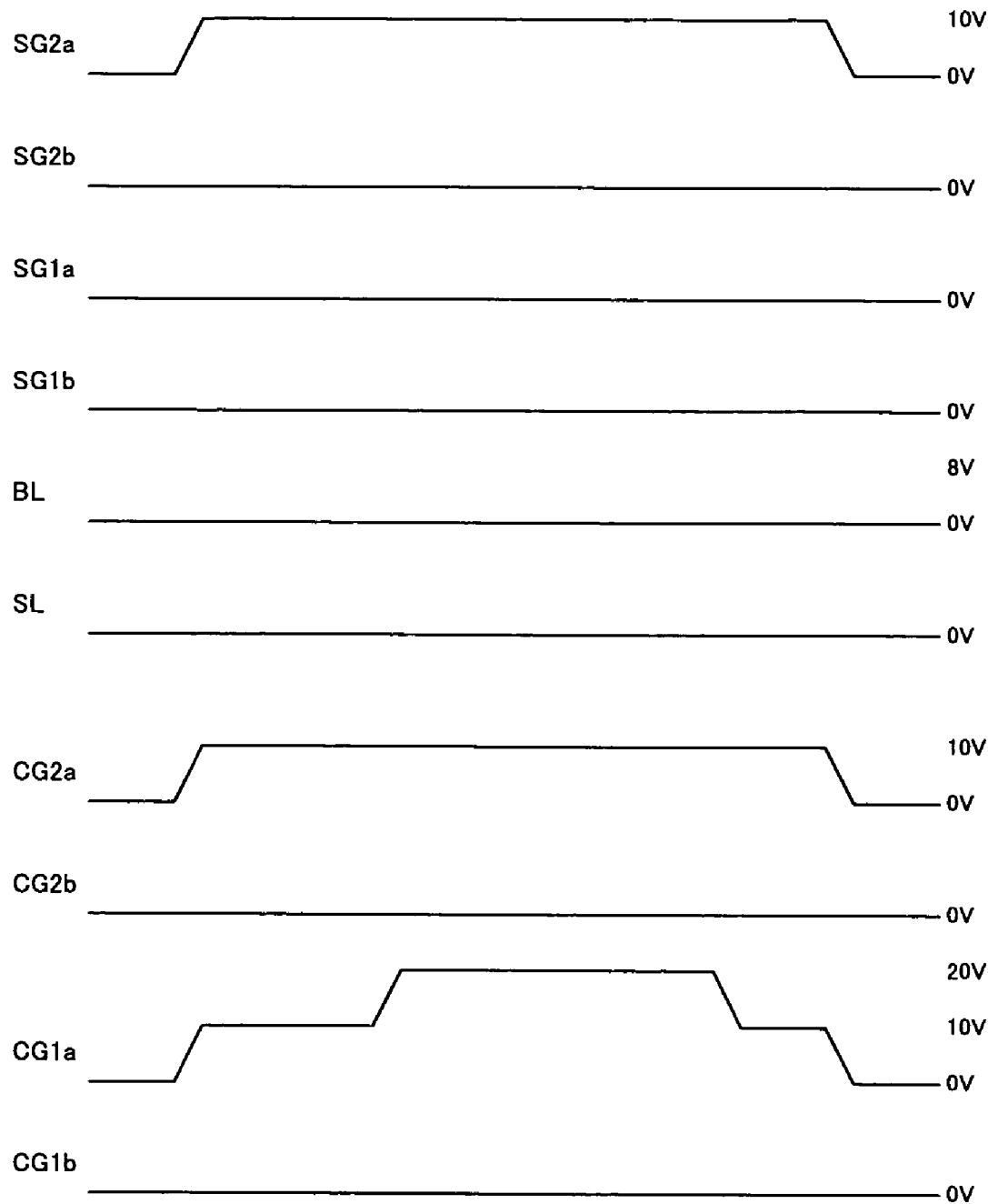
FIG. 4 is a timing chart for application of voltages for the writing operation according to the third embodiment of the present invention.

A timing chart for application of voltages for the writing operation according to the third embodiment is shown in FIG. 4.

Where the writing operation is to be performed selectively on the memory cells of the memory cell units Paa to Pad connected to the control gate line CG1a in the memory cell unit group 101a, 0V is first applied to the control gate lines CG1a, CG2a, the selection gate lines SG2a, SG1a, the source line SL and the bit lines BL. Then, 0V is applied to a bit line of a memory cell unit to be subjected to the writing operation, and 10V is applied to the selection gate line SG2a. Further, 10V is applied to the control gate lines CG2a, CG1a. The selection gate line SG1a is kept at 0V. Thereafter, 20V is applied to the control gate line CG1a. For the other memory cell units not subjected to the writing operation, 8V is applied to bit lines connected to the memory cell units for prevention of the writing. Thus, data is written only in the selected memory cell. When the writing operation is thereafter finished, 10V is applied to the control gate line CG1a, and then 0V is applied to the selection gate line SG2a, the control gate line CG2a and the bit lines. In FIG. 4, the voltages applied to the selection gate lines and the bit lines are simultaneously changed. However, these voltages are not necessarily required to be simultaneously changed, but may be changed in a time-staggered manner.

Fourth Embodiment

Where electrons are to be released from charge storage layers of the memory cells M1, M2 of the memory cell units Paa to Pad in the memory cell unit group 101a selected for an erasing operation, the bit lines BLa to BLd (drain terminal 7 in FIG. 2) and the source line SL (source terminal 11 in FIG. 2) are grounded (GR), and a positive voltage VE1 is applied to the selection gate line SG2a (selection gate 6 in FIG. 2) and the selection gate line SG1a (selection gate 5 in FIG. 2). Further, a negative voltage VN1 is applied to the control gate lines CG1a, CG2a. Thus, a potential difference VN1-GR occurs between the control gates 2, 4 and the channel. At this time, electrons are released from the charge storage layers 1, 3 into floating channels by a tunnel current. The threshold voltages of the memory cells M1, M2 are negatively shifted by the release of the electrons. The memory cell unit group 101b (Pba to Pbd) which shares the control gates CG1a, CG2a with the memory cell unit group 101a are also simultaneously subjected to the erasing operation.

Figure 5:
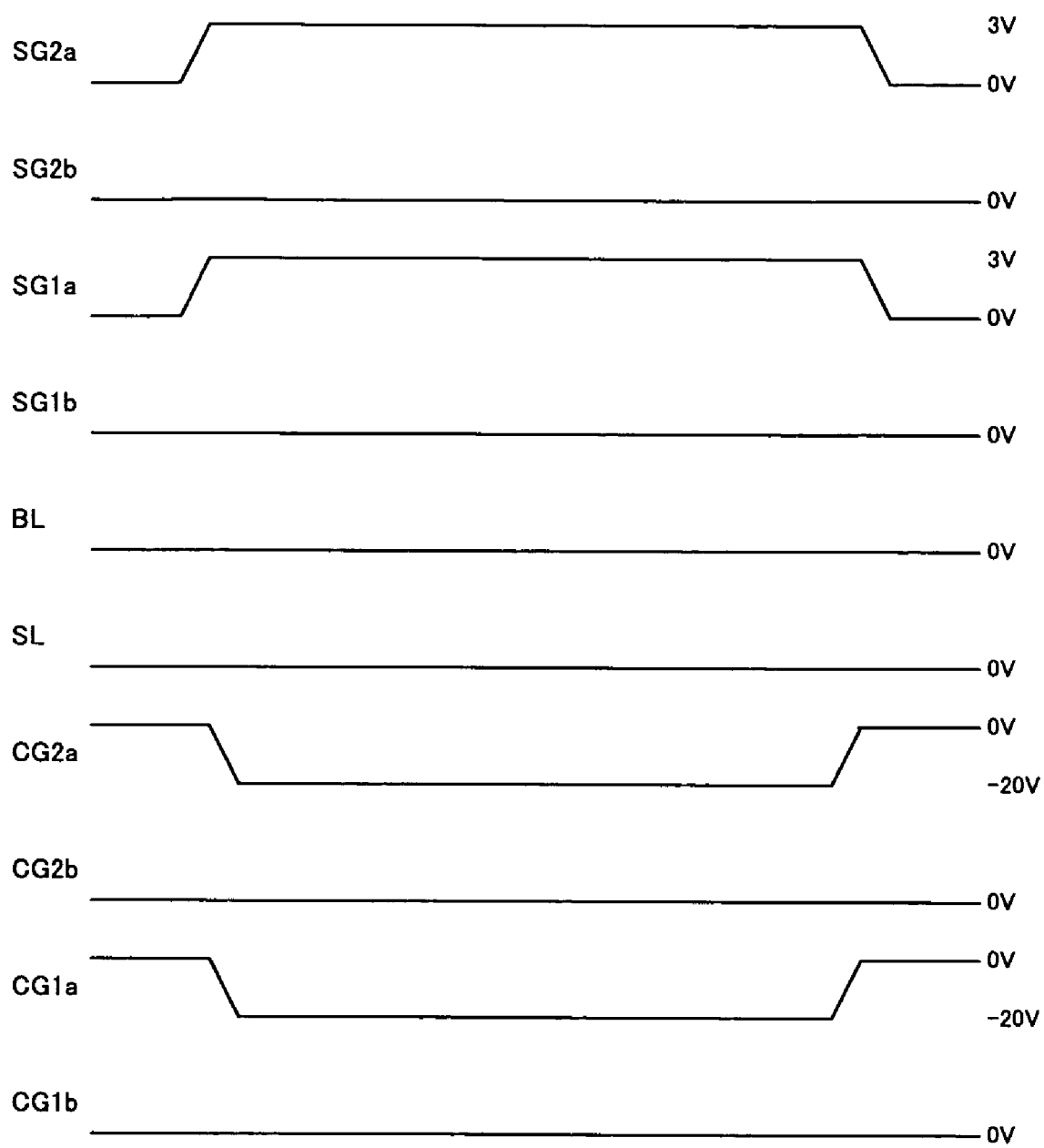
FIG. 5 is a timing chart for application of voltages for the erasing operation according to the fourth embodiment of the present invention.

A timing chart for application of voltages for the erasing operation according to the fourth embodiment is shown in FIG. 5. Where the memory cells connected to the control gate lines CG1a, CG2a are to be selectively subjected to the erasing operation, 0V is first applied to the control gate lines CG1a, CG2a, the selection gate lines SG2a, SG1a, the source line SL and the bit lines BL, and then 3V is applied to the selection gate lines SG2a SG1a. Thereafter, -20V is applied to the control gate lines CG1a, CG2a.

For the other memory cells not subjected to the erasing operation, 0V is applied to the corresponding control gate line for prevention of the erasing. Thus, the selected memory cells are subjected to the erasing operation. When the erasing operation is thereafter finished, 0V is applied to the control gate lines CG1a, CG2a. Then, 0V is applied to the selection gate lines SG2a, SG1a.

Table 5 shows voltages to be applied to the control gate lines CG1a, CG1b, CG2a, CG2b and the selection gate lines SG1a, SG1b, SG2a, SG2b for the reading operation, the writing operation and the erasing operation to be performed on the respective memory cells in the memory cell block 101 shown in FIG. 1 according to the first to third embodiments. In the column "selected cell" of Table 5, a selected memory cell is designated by a control gate line connected to the selected memory cell.

TABLE 5

| | Control gate line | | | | Selection gate line | | | | Bit line BL | Source line SL | Selected memory cell unit group | Selected cell |
|---|---|---|---|---|---|---|---|---|---|---|---|---|
| | CG1a | CG1b | CG2a | CG2b | SG1a | SG1b | SG2a | SG2b | | | | |
| Reading | 0 V | 0 V | 3 V | 0 V | 3 V | 0 V | 3 V | 0 V | 3 V | 0 V | 101a | CG1 |
| | 3 V | | 0 V | | | | | | | | | CG2 |
| | 0 V | | 3 V | | 0 V | 3 V | 0 V | 3 V | | | 101b | CG1 |
| | 3 V | | 0 V | | | | | | | | | CG2 |
| | 0 V | 0 V | 0 V | 3 V | 3 V | 0 V | 0 V | 3 V | | | 101c | CG1 |
| | | 3 V | | 0 V | | | | | | | | CG2 |
| | | 0 V | | 3 V | 0 V | 3 V | 3 V | 0 V | | | 101d | CG1 |
| | | 3 V | | 0 V | | | | | | | | CG2 |
| Writing | 20 V | 0 V | 10 V | 0 V | 0 V | 0 V | 10 V | 0 V | 0 V/8 V | 0 V | 101a | CG1 |
| | 10 V | | 20 V | | | | | | | | | CG2 |
| | 20 V | | 10 V | | | | 0 V | 10 V | | | 101b | CG1 |
| | 10 V | | 20 V | | | | | | | | | CG2 |
| | 0 V | 20 V | 0 V | 10 V | | | 0 V | 10 V | | | 101c | CG1 |
| | | 10 V | | 20 V | | | | | | | | CG2 |
| | | 20 V | | 10 V | | | 10 V | 0 V | | | 101d | CG1 |
| | | 10 V | | 20 V | | | | | | | | CG2 |
| Erasing | -20 V | 0 V | -20 V | 0 V | 3 V | 0 V | 3 V | 0 V | 0 V | 0 V | 101a | CG1, 2 |
| | | | | | 0 V | 3 V | 0 V | 3 V | | | 101b | CG1, 2 |
| | | -20 V | 0 V | -20 V | 3 V | 0 V | 0 V | 3 V | | | 101c | CG1, 2 |
| | | | | | 0 V | 3 V | 3 V | 0 V | | | 101d | CG1, 2 |

Fifth Embodiment

Figure 6:
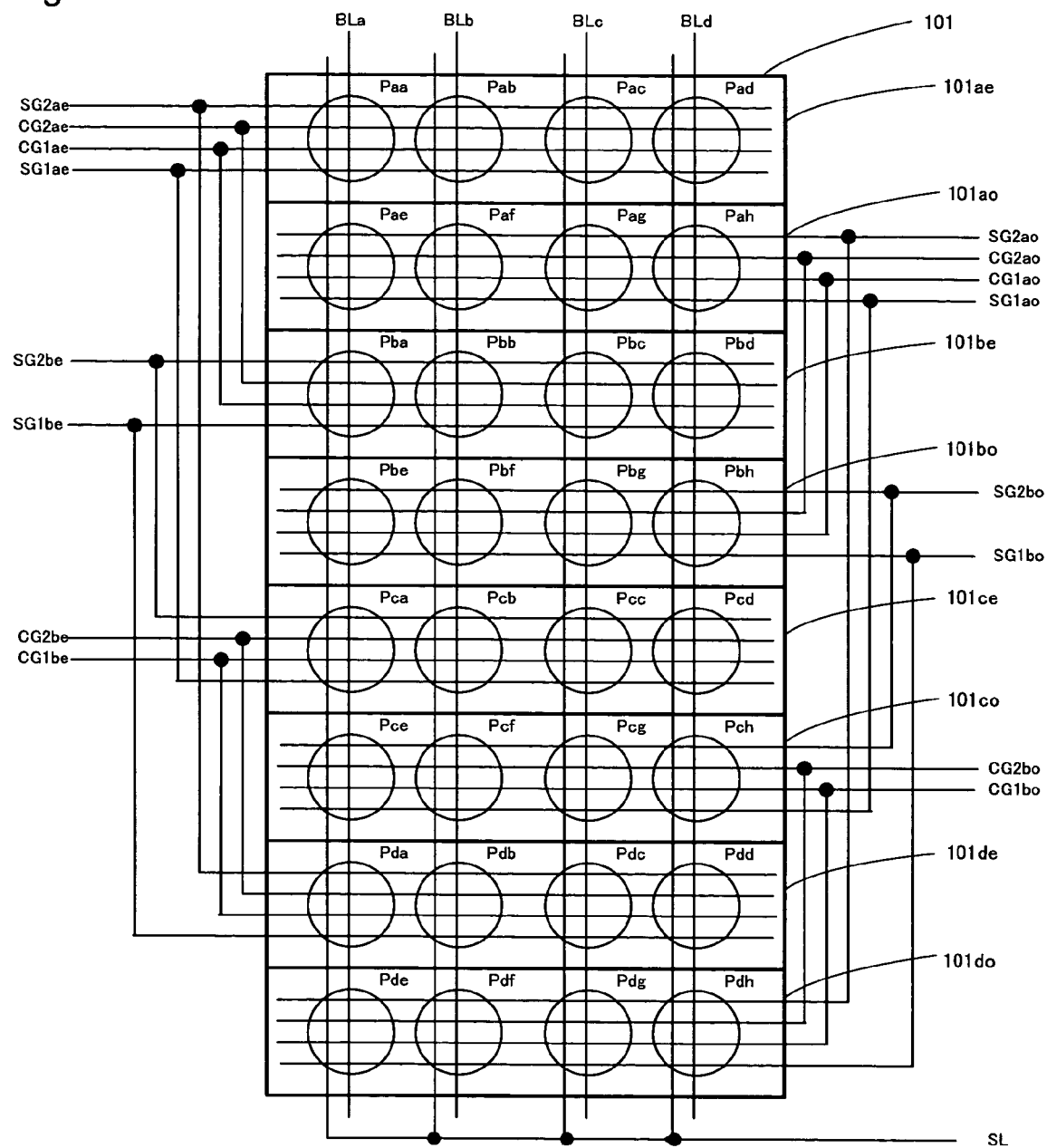
FIG. 6 is a block diagram illustrating the construction of a memory block according to a fifth embodiment of the present invention.

FIG. 6 is a block diagram illustrating the construction of a memory block of a nonvolatile semiconductor storage device according to a fifth embodiment of the present invention. In FIG. 6, components corresponding to those of the prior art memory block shown in FIG. 9 will be denoted by the same reference characters as in FIG. 9. The memory block of the nonvolatile semiconductor storage device according to this embodiment includes NAND memory cell units Paa to Pdh each having a construction as shown in FIG. 2. The memory cell units Paa to Pdh each have two memory cells. In this embodiment, the memory block is constituted by eight memory cell unit groups 101ae to 101de, 101ao to 101do.

In the prior art flash memory shown in FIG. 9, the decoders are disposed on one of laterally opposite sides of the block. In general, the word lines and the bit lines may be taken out from either of opposite ends of the memory cells. Therefore, the decoders are not necessarily required to be disposed on one of the laterally opposite sides of the block. Four (2n)th selection gate lines SG1ae, SG1be, SG2ae, SG2be, four (2n−1)th selection gate lines SG1ao, SG1bo, SG2ao, SG2bo, four (2n)th control gate lines CG1ae, CG1be, CG2ae, CG2be, and four (2n−1)th control gate lines CG1ao, CG1bo, CG2ao, CG2bo (n: a positive integer) are provided for driving selection gates and control gates of the respective memory cell units. In this embodiment, the routing configuration of the (2n−1)th selection gate lines and the (2n−1)th control gate lines is symmetrical to the routing configuration of the (2n)th selection gate lines and the (2n)th control gate lines. By alternately arranging word line decoders for the (2n)th lines and word line decoders for the (2n−1)th lines on the laterally opposite sides of the memory blocks, the decoders can be arranged at a pitch equivalent to the pitch of the memory cell unit groups, and the layout of the decoders and the routing of interconnections between the memory cells and the word line decoders can more easily be achieved with a sufficient margin. Though a decoder group 105 is not shown in FIG. 6 which illustrates the construction of the memory block according to this embodiment, 16 decoders are respectively provided for the control gate lines CG1ae, CG1be, CG2ae, CG2be, CG1ao, CG1bo, CG2ao, CG2bo and the selection gate lines SG1ae, SG1be, SG2ae, SG2be, SG1ao, SG1bo, SG2ao, SG2bo.

The nonvolatile semiconductor storage device of this embodiment may include a plurality of memory blocks each constituted by eight memory cell unit groups as described above according to a required storage capacity. In the nonvolatile semiconductor storage device shown in FIG. 6, four memory cell units are provided in each memory cell unit group, i.e., four bit lines are provided. However, the number of the bit lines may be changed as required. Further, the number of the memory cells provided in each of the memory cell unit group may be changed as required. Voltages to be applied to the memory cell units shown in FIG. 6 and a voltage application sequence for the reading operation, the writing operation and the erasing operations are substantially the same as in the second, third and fourth embodiments. Table 6 shows voltages to be applied to the control gate lines and the selection gate lines for the reading operation, the writing operation and the erasing operation to be performed on the respective memory cells in the memory block shown in FIG. 6. In the column "selected cell" of Table 6, a selected memory cell is designated by a control gate line connected to the selected memory cell.

TABLE 6

| | Control gate line | | | | | | | | Selection gate line | | | | | | | | Bit line BL | Source line SL | Selected memory cell unit group | Selected cell |
|---|---|---|---|---|---|---|---|---|---|---|---|---|---|---|---|---|---|---|---|---|
| | CG1ae | CG1be | CG1ao | CG1bo | CG2ae | CG2be | CG2ao | CG2bo | SG1ae | SG1be | SG1ao | SG1bo | SG2ae | SG2be | SG2ao | SG2bo | | | | |
| Reading | 0 V / 3 V / 0 V | 0 V | 0 V | 0 V | 3 V / 0 V / 0 V | 0 V | 0 V | 0 V | 3 V | 0 V | 0 V | 0 V | 3 V | 0 V | 0 V | 0 V | 3 V | 0 V | 101ae | CG1 |
| | | | | | | | | | | | | | | | | | | | | CG2 |
| | 0 V | 0 V | 0 V / 3 V / 0 V | 0 V | 3 V / 0 V / 0 V | 0 V | 0 V | 0 V | 0 V | 0 V | 3 V | 0 V | 0 V | 0 V | 3 V | 0 V | | | 101ao | CG1 |
| | | | | | | | | | | | | | | | | | | | | CG2 |
| | 0 V | 0 V / 3 V / 0 V | 0 V | 0 V | 0 V | 3 V / 0 V / 0 V | 0 V | 0 V | 0 V | 3 V | 0 V | 0 V | 0 V | 3 V | 0 V | 0 V | | | 101be | CG1 |
| | | | | | | | | | | | | | | | | | | | | CG2 |
| | 0 V | 0 V | 0 V | 0 V / 3 V / 0 V | 0 V | 3 V / 0 V / 0 V | 0 V | 0 V | 0 V | 0 V | 0 V | 3 V | 0 V | 0 V | 0 V | 3 V | | | 101bo | CG1 |
| | | | | | | | | | | | | | | | | | | | | CG2 |
| | 0 V | 0 V | 0 V | 0 V | 0 V | 0 V | 3 V / 0 V / 0 V | 0 V | 3 V | 0 V | 0 V | 0 V | 3 V | 0 V | 0 V | 0 V | | | 101ce | CG1 |
| | | | | | | | | | | | | | | | | | | | | CG2 |
| | 0 V | 0 V | 0 V | 0 V | 0 V | 0 V | 0 V | 3 V / 0 V / 0 V | 0 V | 0 V | 3 V | 0 V | 0 V | 0 V | 3 V | 0 V | | | 101co | CG1 |
| | | | | | | | | | | | | | | | | | | | | CG2 |
| | 0 V | 0 V | 0 V | 0 V | 0 V | 0 V | 3 V / 0 V / 0 V | 0 V | 0 V | 3 V | 0 V | 0 V | 0 V | 3 V | 0 V | 0 V | | | 101de | CG1 |
| | | | | | | | | | | | | | | | | | | | | CG2 |
| | 0 V | 0 V | 0 V | 0 V | 0 V | 0 V | 0 V | 3 V / 0 V / 0 V | 0 V | 0 V | 0 V | 3 V | 0 V | 0 V | 0 V | 3 V | | | 101do | CG1 |
| | | | | | | | | | | | | | | | | | | | | CG2 |
| Writing | 20 V / 10 V / 0 V | 0 V | 0 V | 0 V | 10 V / 20 V / 0 V | 0 V | 0 V | 0 V | 0 V | 0 V | 0 V | 0 V | 10 V | 0 V | 0 V | 0 V | 0 V / 8 V | | 101ae | CG1 |
| | | | | | | | | | | | | | | | | | | | | CG2 |
| | 0 V | 0 V | 20 V / 10 V / 0 V | 0 V | 10 V / 20 V / 0 V | 0 V | 0 V | 0 V | 0 V | 0 V | 0 V | 0 V | 0 V | 0 V | 10 V | 0 V | | | 101ao | CG1 |
| | | | | | | | | | | | | | | | | | | | | CG2 |
| | 0 V | 20 V / 10 V / 0 V | 0 V | 0 V | 0 V | 10 V / 20 V / 0 V | 0 V | 0 V | 0 V | 0 V | 0 V | 0 V | 10 V | 0 V | 0 V | 0 V | | | 101be | CG1 |
| | | | | | | | | | | | | | | | | | | | | CG2 |
| | 0 V | 0 V | 0 V | 20 V / 10 V / 0 V | 0 V | 10 V / 20 V / 0 V | 0 V | 0 V | 0 V | 0 V | 0 V | 0 V | 0 V | 0 V | 10 V | 0 V | | | 101bo | CG1 |
| | | | | | | | | | | | | | | | | | | | | CG2 |
| | 0 V | 0 V | 0 V | 0 V | 0 V | 0 V | 10 V / 20 V / 0 V | 0 V | 0 V | 0 V | 0 V | 0 V | 10 V | 0 V | 0 V | 0 V | | | 101ce | CG1 |
| | | | | | | | | | | | | | | | | | | | | CG2 |
| | 0 V | 0 V | 0 V | 0 V | 0 V | 0 V | 0 V | 10 V / 20 V / 0 V | 0 V | 0 V | 0 V | 0 V | 0 V | 0 V | 10 V | 0 V | | | 101co | CG1 |
| | | | | | | | | | | | | | | | | | | | | CG2 |
| | 0 V | 0 V | 0 V | 0 V | 0 V | 0 V | 10 V / 20 V / 0 V | 0 V | 0 V | 0 V | 0 V | 0 V | 10 V | 0 V | 0 V | 0 V | | | 101de | CG1 |
| | | | | | | | | | | | | | | | | | | | | CG2 |
| | 0 V | 0 V | 0 V | 0 V | 0 V | 0 V | 0 V | 10 V / 20 V / 0 V | 0 V | 0 V | 0 V | 0 V | 0 V | 0 V | 10 V | 0 V | | | 101do | CG1 |
| | | | | | | | | | | | | | | | | | | | | CG2 |
| Erasing | −20 V | 0 V | 0 V | 0 V | −20 V | 0 V | 0 V | 0 V | 3 V / 0 V / 0 V / 3 V / 0 V / 0 V / 0 V | 0 V / 3 V / 0 V / 0 V / 3 V / 0 V / 0 V | 0 V / 0 V / 3 V / 0 V / 0 V / 3 V / 0 V | 0 V / 0 V / 0 V / 3 V / 0 V / 0 V / 3 V | 3 V / 0 V / 0 V / 3 V / 0 V / 0 V / 0 V | 0 V / 3 V / 0 V / 0 V / 3 V / 0 V / 0 V | 0 V / 0 V / 3 V / 0 V / 0 V / 3 V / 0 V | 0 V / 0 V / 0 V / 3 V / 0 V / 0 V / 3 V | 0 V | 0 V | 101ae, 101ao, 101be, 101bo, 101ce, 101co, 101de, 101do | CG1, 2 |
| | 0 V | −20 V | 0 V | 0 V | 0 V | −20 V | 0 V | 0 V | | | | | | | | | | | | CG1, 2 |

Sixth Embodiment

Figure 7:
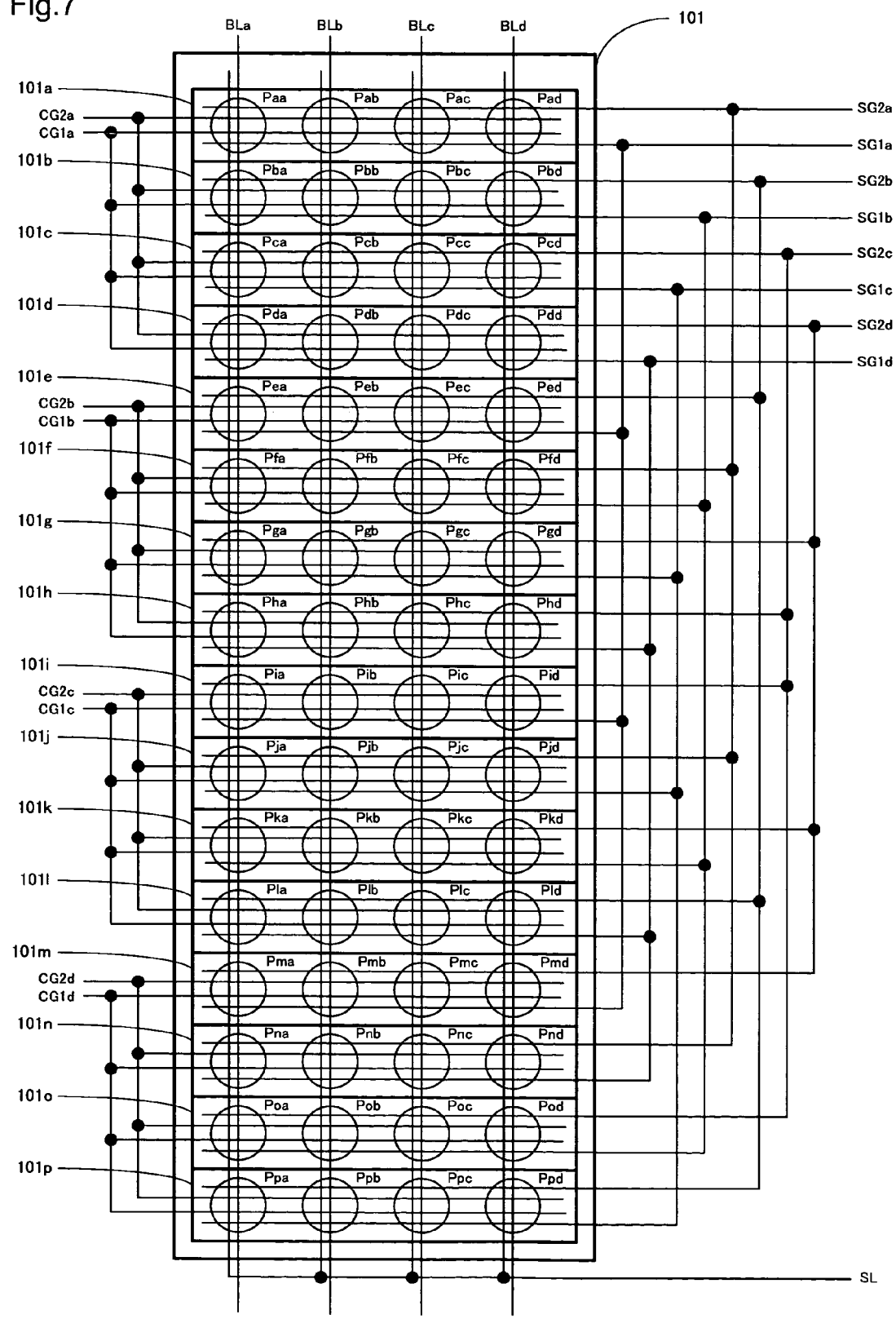
FIG. 7 is a block diagram illustrating the construction of a memory block according to a seventh embodiment of the present invention.

FIG. 7 is a block diagram illustrating the construction of a memory block of a nonvolatile semiconductor storage device according to a seventh embodiment of the present invention. In this embodiment, control gate lines and selection gate lines are each connected commonly to four lines. In FIG. 7, components corresponding to those of the prior art memory block shown in FIG. 9 will be denoted by the same reference characters as in FIG. 9. The memory block of the nonvolatile semiconductor storage device according to this embodiment includes NAND memory cell units Paa to Ppd each having a construction as shown in FIG. 2 and each including two memory cells. As shown in FIG. 7, the memory block 101 is constituted by 16 memory cell unit groups 101a to 101p, and four selection gate lines SG1a to SG1d, four selection gate lines SG2a to SG2d, four control gate lines CG1a to CG1d and four control gate lines CG2a to CG2d are each shared by four of the 16 memory cell unit groups 101a to 101p. For example, the memory cell unit group 101a (Paa to Pad) are selected by the selection gate lines SG1a, SG2a and the control gate lines CG1a, CG2a. The memory cell unit group 101b (Pba to Pbd) is selected by the selection gate lines SG1b, SG2b and the control gate lines CG1a, CG2a. The memory cell unit group 101c (Pca to Pcd) are selected by the selection gate lines SG1c, SG2c and the control gate lines CG1a, CG2a. Table 6 shows SG2, SG1 and CG to be selected for respective status values of address signals A0 to A4. The nonvolatile semiconductor storage device further includes four bit lines BLa to BLd connected to the selection gate lines and the control gate lines in an intersecting manner, and a common source line SL.

The nonvolatile semiconductor storage device of this embodiment may include a plurality of memory blocks each including 16 memory cell unit groups as described above according to a required storage capacity. In the nonvolatile semiconductor storage device shown in FIG. 7, four memory cell units are provided in each memory cell unit group, i.e., four bit lines are provided. However, the number of the bit lines may be changed as required. Further, the number of the memory cells provided in each of the memory cell unit groups may be changed as required. Voltages to be applied to the memory cell units shown in FIG. 7 and a voltage application sequence for the reading operation, the writing operation and the erasing operations are substantially the same as in the second, third and fourth embodiments. Table 7 shows voltages to be applied to the control gate lines and the selection gate lines for the reading operation, the writing operation and the erasing operation to be performed on the respective memory cells in the memory block shown in FIG. 7. In the column "selected cell" of Table 7, a selected memory cell is designated by a control gate line connected to the selected memory cell.

In this embodiment, (2n)th selection gate lines and (2n–1)th selection gate lines (n: a positive integer) may be provided as the selection gate lines, and (2n)th control gate lines and (2n–1)th control gate lines may be provided as the control gate lines as in the fifth embodiment. In this case, blocks may each be constituted by 32 memory cell unit groups, and word line decoders for the (2n)th selection gate lines and the (2n)th control gate lines and word line decoders for the (2n–1)th selection gate lines and the (2n–1)th control gate lines may alternately be disposed on opposite sides of the memory blocks. Thus, the layout of the decoders can more easily be achieved.

TABLE 7

| | Control gate line | | | | | | | | Selection gate line | | | | | | | | Bit line BL | Source line SL | Selected memory cell unit group | Selected cell |
|---|---|---|---|---|---|---|---|---|---|---|---|---|---|---|---|---|---|---|---|---|
| | CG1a | CG1b | CG1c | CG1d | CG2a | CG2b | CG2c | CG2d | SG1a | SG1b | SG1c | SG1d | SG2a | SG2b | SG2c | SG2d | | | | |
| Reading | 0 V | | | | 3 V | | | | 3 V | 0 V | 0 V | 0 V | 3 V | 0 V | 0 V | 0 V | 3 V | 0 V | 101a | CG1 |
| | 3 V | | | | 0 V | | | | 3 V | 0 V | 0 V | 0 V | 3 V | 0 V | 0 V | 0 V | | | 101a | CG2 |
| | 0 V | | | | 3 V | | | | 0 V | 3 V | 0 V | 0 V | 3 V | 0 V | 0 V | 0 V | | | 101b | CG1 |
| | 3 V | | | | 0 V | | | | 0 V | 3 V | 0 V | 0 V | 3 V | 0 V | 0 V | 0 V | | | 101b | CG2 |
| | 0 V | | | | 3 V | | | | 0 V | 0 V | 3 V | 0 V | 3 V | 0 V | 0 V | 0 V | | | 101c | CG1 |
| | 3 V | | | | 0 V | | | | 0 V | 0 V | 3 V | 0 V | 3 V | 0 V | 0 V | 0 V | | | 101c | CG2 |
| | 0 V | | | | 3 V | | | | 0 V | 0 V | 0 V | 3 V | 3 V | 0 V | 0 V | 0 V | | | 101d | CG1 |
| | 3 V | | | | 0 V | | | | 0 V | 0 V | 0 V | 3 V | 3 V | 0 V | 0 V | 0 V | | | 101d | CG2 |
| | | 0 V | | | | 3 V | | | 3 V | 0 V | 0 V | 0 V | 0 V | 3 V | 0 V | 0 V | | | 101e | CG1 |
| | | 3 V | | | | 0 V | | | 3 V | 0 V | 0 V | 0 V | 0 V | 3 V | 0 V | 0 V | | | 101e | CG2 |
| | | 0 V | | | | 3 V | | | 0 V | 3 V | 0 V | 0 V | 0 V | 3 V | 0 V | 0 V | | | 101f | CG1 |
| | | 3 V | | | | 0 V | | | 0 V | 3 V | 0 V | 0 V | 0 V | 3 V | 0 V | 0 V | | | 101f | CG2 |
| | | 0 V | | | | 3 V | | | 0 V | 0 V | 3 V | 0 V | 0 V | 3 V | 0 V | 0 V | | | 101g | CG1 |
| | | 3 V | | | | 0 V | | | 0 V | 0 V | 3 V | 0 V | 0 V | 3 V | 0 V | 0 V | | | 101g | CG2 |
| | | 0 V | | | | 3 V | | | 0 V | 0 V | 0 V | 3 V | 0 V | 3 V | 0 V | 0 V | | | 101h | CG1 |
| | | 3 V | | | | 0 V | | | 0 V | 0 V | 0 V | 3 V | 0 V | 3 V | 0 V | 0 V | | | 101h | CG2 |
| | | | 0 V | | | | 3 V | | 3 V | 0 V | 0 V | 0 V | 0 V | 0 V | 3 V | 0 V | | | 101i | CG1 |
| | | | 3 V | | | | 0 V | | 3 V | 0 V | 0 V | 0 V | 0 V | 0 V | 3 V | 0 V | | | 101i | CG2 |
| | | | 0 V | | | | 3 V | | 0 V | 3 V | 0 V | 0 V | 0 V | 0 V | 3 V | 0 V | | | 101j | CG1 |
| | | | 3 V | | | | 0 V | | 0 V | 3 V | 0 V | 0 V | 0 V | 0 V | 3 V | 0 V | | | 101j | CG2 |
| | | | 0 V | | | | 3 V | | 0 V | 0 V | 3 V | 0 V | 0 V | 0 V | 3 V | 0 V | | | 101k | CG1 |
| | | | 3 V | | | | 0 V | | 0 V | 0 V | 3 V | 0 V | 0 V | 0 V | 3 V | 0 V | | | 101k | CG2 |
| | | | 0 V | | | | 3 V | | 0 V | 0 V | 0 V | 3 V | 0 V | 0 V | 3 V | 0 V | | | 101l | CG1 |
| | | | 3 V | | | | 0 V | | 0 V | 0 V | 0 V | 3 V | 0 V | 0 V | 3 V | 0 V | | | 101l | CG2 |
| | | | | 0 V | | | | 3 V | 3 V | 0 V | 0 V | 0 V | 0 V | 0 V | 0 V | 3 V | | | 101m | CG1 |
| | | | | 3 V | | | | 0 V | 3 V | 0 V | 0 V | 0 V | 0 V | 0 V | 0 V | 3 V | | | 101m | CG2 |
| | | | | 0 V | | | | 3 V | 0 V | 3 V | 0 V | 0 V | 0 V | 0 V | 0 V | 3 V | | | 101n | CG1 |
| | | | | 3 V | | | | 0 V | 0 V | 3 V | 0 V | 0 V | 0 V | 0 V | 0 V | 3 V | | | 101n | CG2 |
| | | | | 0 V | | | | 3 V | 0 V | 0 V | 3 V | 0 V | 0 V | 0 V | 0 V | 3 V | | | 101o | CG1 |
| | | | | 3 V | | | | 0 V | 0 V | 0 V | 3 V | 0 V | 0 V | 0 V | 0 V | 3 V | | | 101o | CG2 |
| | | | | 0 V | | | | 3 V | 0 V | 0 V | 0 V | 3 V | 0 V | 0 V | 0 V | 3 V | | | 101p | CG1 |
| | | | | 3 V | | | | 0 V | 0 V | 0 V | 0 V | 3 V | 0 V | 0 V | 0 V | 3 V | | | 101p | CG2 |
| Writing | 20 V | 20 V | | | 10 V | 10 V | | | 10 V | 0 V | 0 V | 0 V | 10 V | 0 V | 0 V | 0 V | 0 V/8 V | 0 V | 101a | CG1 |
| | 10 V | 10 V | | | 20 V | 20 V | | | 10 V | 0 V | 0 V | 0 V | 10 V | 0 V | 0 V | 0 V | | | 101b | CG2 |
| | 20 V | 20 V | | | 10 V | 10 V | | | 0 V | 10 V | 0 V | 0 V | 10 V | 0 V | 0 V | 0 V | | | 101c | CG1 |
| | 10 V | 10 V | | | 20 V | 20 V | | | 0 V | 10 V | 0 V | 0 V | 10 V | 0 V | 0 V | 0 V | | | 101d | CG2 |
| | 20 V | 20 V | | | 10 V | 10 V | | | 0 V | 0 V | 10 V | 0 V | 10 V | 0 V | 0 V | 0 V | | | 101e | CG1 |
| | 10 V | 10 V | | | 20 V | 20 V | | | 0 V | 0 V | 10 V | 0 V | 10 V | 0 V | 0 V | 0 V | | | 101f | CG2 |
| | 20 V | 20 V | | | 10 V | 10 V | | | 0 V | 0 V | 0 V | 10 V | 10 V | 0 V | 0 V | 0 V | | | | |
| | 0 V | 0 V | | | 0 V | 0 V | | | 0 V | 0 V | 0 V | 10 V | 10 V | 0 V | 0 V | 0 V | | | | |

TABLE 7-continued

| | Control gate line | | | | | | | | Selection gate line | | | | | | | | Bit line BL | Source line SL | Selected memory cell unit group | Selected cell |
|---|---|---|---|---|---|---|---|---|---|---|---|---|---|---|---|---|---|---|---|---|
| | CG1a | CG1b | CG1c | CG1d | CG2a | CG2b | CG2c | CG2d | SG1a | SG1b | SG1c | SG1d | SG2a | SG2b | SG2c | SG2d | | | | |
| | | 20 V | 20 V | | | 10 V | 10 V | | 0 V | 0 V | 0 V | 0 V | 0 V | 0 V | 0 V | 10 V | | | 101g | CG1 |
| | | 10 V | 10 V | | | 20 V | 20 V | | 0 V | 0 V | 0 V | 0 V | 0 V | 0 V | 10 V | 0 V | | | 101h | CG2 |
| | | 20 V | 20 V | | | 10 V | 10 V | | 0 V | 0 V | 0 V | 0 V | 0 V | 0 V | 10 V | 0 V | | | 101i | CG1 |
| | | 10 V | 10 V | | | 20 V | 20 V | | 0 V | 0 V | 0 V | 0 V | 10 V | 0 V | 0 V | 0 V | | | 101j | CG2 |
| | 0 V | 0 V | | 0 V | 0 V | | 10 V | 0 V | 0 V | 0 V | 0 V | 0 V | 0 V | 0 V | 10 V | 0 V | | | 101k | CG1 |
| | | | | | | | 20 V | | | | | | | | | | | | 101l | CG2 |
| | | | | | | | 10 V | | | | | | | | | | | | 101m | CG1 |
| | | | | | | | 20 V | | | | | | | | | | | | 101n | CG2 |
| | | 0 V | | 20 V | | 0 V | 0 V | 10 V | 0 V | 0 V | 0 V | 0 V | 0 V | 0 V | 0 V | 10 V | | | 101m | CG1 |
| | | | | 10 V | | | | 20 V | | | | | | | | | | | 101n | CG2 |
| | | | | 20 V | | | | 10 V | | | | | | 10 V | | | | | 101o | CG1 |
| | | | | 10 V | | | | 20 V | | | | | | | | | | | 101p | CG2 |
| | | | | 20 V | | | | 10 V | 0 V | 0 V | 0 V | 0 V | 0 V | 10 V | 0 V | 0 V | | | | |
| | | | | 10 V | | | | 20 V | | | | | | | | | | | | |
| | | | | 0 V | | | | 0 V | | | | | | | | | | | | |
| Erasing | −20 V | 0 V | 0 V | 0 V | −20 V | 0 V | 0 V | 0 V | 3 V | 0 V | 0 V | 0 V | 3 V | 0 V | 0 V | 0 V | 0 V | 0 V | 101a | CG1, 2 |
| | | | | | | | | | 0 V | 3 V | 0 V | 0 V | 0 V | 3 V | 0 V | 0 V | | | 101b | CG1, 2 |
| | | | | | | | | | 0 V | 0 V | 3 V | 0 V | 0 V | 0 V | 3 V | 0 V | | | 101c | CG1, 2 |
| | | | | | | | | | 0 V | 0 V | 0 V | 3 V | 0 V | 0 V | 0 V | 3 V | | | 101d | CG1, 2 |
| | 0 V | −20 V | 0 V | 0 V | 0 V | −20 V | 0 V | 0 V | 3 V | 0 V | 0 V | 0 V | 3 V | 0 V | 0 V | 0 V | | | 101e | CG1, 2 |
| | | | | | | | | | 0 V | 3 V | 0 V | 0 V | 0 V | 3 V | 0 V | 0 V | | | 101f | CG1, 2 |
| | | | | | | | | | 0 V | 0 V | 3 V | 0 V | 0 V | 0 V | 3 V | 0 V | | | 101g | CG1, 2 |
| | | | | | | | | | 0 V | 0 V | 0 V | 3 V | 0 V | 0 V | 0 V | 3 V | | | 101h | CG1, 2 |
| | 0 V | 0 V | −20 V | 0 V | 0 V | 0 V | −20 V | 0 V | 3 V | 0 V | 0 V | 0 V | 3 V | 0 V | 0 V | 0 V | | | 101i | CG1, 2 |
| | | | | | | | | | 0 V | 3 V | 0 V | 0 V | 0 V | 3 V | 0 V | 0 V | | | 101j | CG1, 2 |
| | | | | | | | | | 0 V | 0 V | 3 V | 0 V | 0 V | 0 V | 3 V | 0 V | | | 101k | CG1, 2 |
| | | | | | | | | | 0 V | 0 V | 0 V | 3 V | 0 V | 0 V | 0 V | 3 V | | | 101l | CG1, 2 |
| | 0 V | 0 V | 0 V | −20 V | 0 V | 0 V | 0 V | −20 V | 3 V | 0 V | 0 V | 0 V | 3 V | 0 V | 0 V | 0 V | | | 101m | CG1, 2 |
| | | | | | | | | | 0 V | 3 V | 0 V | 0 V | 0 V | 3 V | 0 V | 0 V | | | 101n | CG1, 2 |
| | | | | | | | | | 0 V | 0 V | 3 V | 0 V | 0 V | 0 V | 3 V | 0 V | | | 101o | CG1, 2 |
| | | | | | | | | | 0 V | 0 V | 0 V | 3 V | 0 V | 0 V | 0 V | 3 V | | | 101p | CG1, 2 |

Seventh Embodiment

Figure 8:
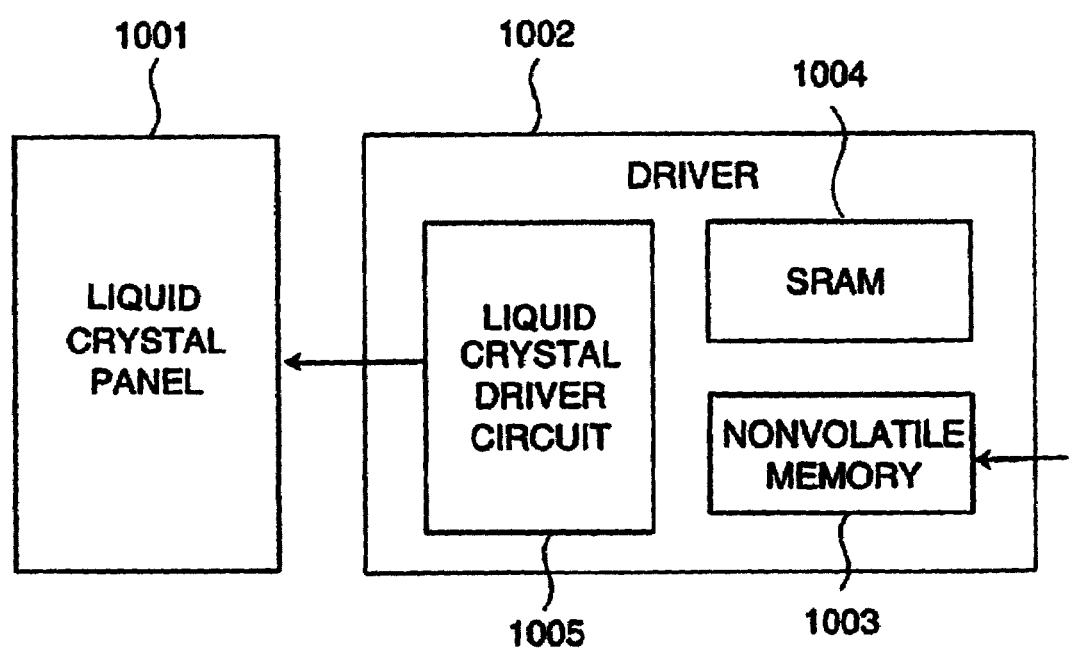
FIG. 8 is a block diagram of a liquid crystal display device including a nonvolatile semiconductor storage device of the present invention for image adjustment of a liquid crystal panel.

The semiconductor storage devices described above are applicable to a rewritable nonvolatile memory for image adjustment of a liquid crystal panel of a liquid crystal display device as shown in FIG. 8.

The liquid crystal panel 1001 is driven by a liquid crystal driver 1002. The liquid crystal driver 1002 includes a nonvolatile memory section 1003, an SRAM section 1004 and a liquid crystal driver circuit 1005 provided therein. The nonvolatile memory section 1003 comprises any of the inventive semiconductor storage devices, preferably the semiconductor storage device according to the second embodiment. The nonvolatile memory section 1003 is configured so as to be rewritable from the outside.

Information stored in the nonvolatile memory section 1003 is transferred to the SRAM section 1004 when the liquid crystal panel 1001 is turned on. The liquid crystal driver circuit 1005 is capable of reading the information out of the SRAM section 1004 as required. The provision of the SRAM section 1004 makes it possible to read out the information at a very high speed.

The liquid crystal driver 1002 is provided outside the liquid crystal panel 1001 as shown in FIG. 8, but may be provided on the liquid crystal panel 1001.

The liquid crystal panel 1001 is adapted to change the tones of pixels thereof by applying a multi-level voltage to each of the pixels. However, a relationship between the applied voltage and the tone varies from panel to panel. Therefore, information for compensation for the panel-to-panel variation is stored after the production of the liquid crystal panel, and a panel-to-panel variation in image quality is eliminated by the compensation based on the information. Therefore, it is preferred to incorporate a rewritable nonvolatile memory for storing the compensation information, and to employ any of the inventive semiconductor storage devices as the nonvolatile memory. Since the size reduction of a semiconductor device can be achieved by employing any of the inventive semiconductor storage devices, it is possible to produce the semiconductor device at lower costs. Therefore, the liquid crystal display device can be produced at lower costs.

According to the present invention, the memory cells can each uniquely be selected on the basis of a combination of the common control gate line and the first and second selection gate lines. Therefore, the total number of the word line decoders required for the driving of the control gate lines and the selection gate lines can be reduced. Hence, the total area of the word line decoders can correspondingly be reduced, making the layout of the word line decoders easier.

Where the number of the control gate lines connected to the common control gate line and the total number of the first and second selection gate lines to be connected to the first and second common selection gate lines are each $2^k$ ($k \geq 1$) and k is greater than 1, the total number of the word line decoders can further be reduced. Therefore, the total area of the word line decoders can further be reduced, making the layout of the word line decoders further easier.

Where the common control gate line and the first and second common selection gate lines are routed symmetrically in each two adjacent memory cell unit groups, and the word line decoders are alternately arranged on opposite sides of the respective memory blocks, the decoders can be arranged at a pitch equivalent to the pitch of the memory cell unit groups, and the layout of the decoders and the routing of interconnections between the memory cells and the word line decoders can be achieved with a sufficient margin. This makes the layout of the word line decoders further easier.

Where the inventive liquid crystal display comprises the inventive semiconductor storage device, the size reduction of the semiconductor device can be achieved, making it possible to produce the semiconductor device at lower costs. Therefore, the liquid crystal display device can be produced at lower costs.

What is claimed is:

1. A nonvolatile semiconductor storage device comprising:
   a plurality of memory cell unit groups each comprising one or more NAND nonvolatile memory cell units each comprising at least one memory cell having a charge storage layer and a control gate, a first selection transistor disposed at one end of the memory cell and having a first selection gate, and a second selection transistor disposed at the other end of the memory cell and having a second selection gate, the memory cell unit groups each further comprising a control gate line connected to the control gate of the memory cell of each of the memory cell units, a first selection gate line connected to the first selection gate of the first selection transistor of each of the memory cell units, and a second selection gate line connected to the second selection gate of the second selection transistor of each of the memory cell units;
   a common control gate line connected commonly to the control gate lines of different ones of the memory cell unit groups;
   a first common selection gate line connected commonly to the first selection gate lines of different ones of the memory cell unit groups; and
   a second common selection gate line connected commonly to the second selection gate lines of different ones of the memory cell unit groups;
   wherein the common control gate line is connected commonly to the control gate lines of at least two of the memory cell unit groups selected in a first combination,
   wherein the first common selection gate line is connected commonly to the first selection gate lines of at least two of the memory cell unit groups selected in a second combination different from the first combination,
   wherein the second common selection gate line is connected commonly to the second selection gate lines of at least two of the memory cell unit groups selected in a third combination different from the first and second combinations; and
   wherein the memory cells in the respective memory cell unit groups are each uniquely selected on the basis of a combination of the common control gate line and the first and second common selection gate lines.

2. A nonvolatile semiconductor storage device as set forth in claim 1,
   wherein the at least one memory cell of each of the NAND nonvolatile memory cell units includes a plurality of memory cells arranged in series,
   wherein the control gate line of each of the memory cell unit groups includes a plurality of control gate lines, which are respectively connected to the control gates of the memory cells of each of the NAND nonvolatile memory cell units in each of the memory cell unit groups and are each connected commonly to the control gates of corresponding ones of the memory cells of the respective NAND memory cell units.

3. A nonvolatile semiconductor storage device as set forth in claim 1, wherein a number of the control gate lines of the respective memory cell unit groups connected to the common control gate line and a total number of the first and second selection gate lines of the respective memory cell unit groups connected to the first and second common selection gate lines are each $2^k$ ($k \geq 1$).

4. A nonvolatile semiconductor storage device as set forth in claim 1, wherein the memory cell unit groups constitute a memory block, wherein the common control gate line and the first and second common selection gate lines of one memory cell unit group are routed from a side opposite the side of the memory block from which the common adjacent memory cell unit group are routed.

5. A liquid crystal display device comprising a semiconductor storage device as recited in claim 1.

* * * * *